US012777760B2

(12) United States Patent
(10) Patent No.: US 12,777,760 B2
(45) Date of Patent: Oct. 27, 2026

Son et al.

(54) DISPLAY DEVICE AND METHOD FOR FABRICATING THE SAME

(71) Applicant: Samsung Display Co., LTD., Yongin-si (KR)

(72) Inventors: Kyung Rock Son, Yongin-si (KR); Jae Phil Lee, Yongin-si (KR); Hui Won Yang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 169 days.

(21) Appl. No.: 18/917,889

(22) Filed: Oct. 16, 2024

(65) Prior Publication Data

US 2025/0160083 A1 May 15, 2025

(30) Foreign Application Priority Data

Nov. 9, 2023 (KR) ........................ 10-2023-0154059

(51) Int. Cl.

| | |
|---|---|
| ***H10H 20/857*** | (2025.01) |
| ***H10H 20/01*** | (2025.01) |
| ***H10H 20/856*** | (2025.01) |
| ***H10W 90/00*** | (2026.01) |

(52) U.S. Cl.

CPC ........ *H10H 20/857* (2025.01); *H10H 20/856* (2025.01); *H10W 90/00* (2026.01); *H10H 20/0363* (2025.01); *H10H 20/0364* (2025.01)

(58) Field of Classification Search

CPC ............... H10H 20/857; H10H 20/856; H10H 20/0363; H10H 20/0364; H10H 20/84; H10H 20/851; H10W 90/00; H10D 86/441; H10D 86/451

See application file for complete search history.

(56) References Cited

U.S. PATENT DOCUMENTS 10,147,776 B2 * 12/2018 Nam .................. H10K 59/1201
12,433,097 B2 * 9/2025 Imai ................... H10K 59/1201
12,520,707 B2 * 1/2026 Tabatake .............. H10K 59/873

(Continued)

FOREIGN PATENT DOCUMENTS

KR 2022-0043757 A 4/2022
KR 2023-0102354 A 7/2023

(Continued)

*Primary Examiner* — Mary Ellen Bowman

(74) *Attorney, Agent, or Firm* — Womble Bond Dickinson (US) LLP

(57) ABSTRACT

The present disclosure provides a display device and a method of manufacturing the same. A display device includes a common electrode and a pixel electrode spaced from each other on a substrate, a bank having an opening exposing a portion of the pixel electrode and the common electrode, a first reflective electrode on a top surface of the bank along the opening on a top surface of the pixel electrode, and a second reflective electrode on a top surface of the bank along the opening on a top surface of the common electrode, an organic pattern layer on the pixel electrode and the common electrode in the opening, a light emitting element on the organic pattern layer and including a first contact electrode and a second contact electrode on a top surface, and a first via layer having a height that is less than that of the light emitting element.

20 Claims, 30 Drawing Sheets

(56) References Cited

U.S. PATENT DOCUMENTS

| | | | | |
|---|---|---|---|---|
| 2013/0001620 | A1* | 1/2013 | Sugisawa | H10K 59/122<br>257/E33.062 |
| 2019/0229242 | A1* | 7/2019 | Yoon | H10H 20/815 |
| 2019/0334112 | A1* | 10/2019 | Lee | H10K 59/122 |
| 2020/0258960 | A1* | 8/2020 | Choi | H10K 59/121 |
| 2021/0271123 | A1* | 9/2021 | Lee | G02F 1/1343 |
| 2022/0123090 | A1* | 4/2022 | Yang | H10K 59/1201 |
| 2022/0157899 | A1* | 5/2022 | Yanagisawa | H10K 59/88 |
| 2023/0219114 | A1* | 7/2023 | Takenaka | B05D 1/60<br>427/255.6 |
| 2024/0138210 | A1* | 4/2024 | Kong | H10K 59/353 |
| 2024/0138239 | A1* | 4/2024 | Kim | H10H 20/857 |
| 2025/0143043 | A1* | 5/2025 | Son | H10H 20/84 |

FOREIGN PATENT DOCUMENTS

| | | | |
|---|---|---|---|
| KR | 2023-0124870 | A | 8/2023 |
| KR | 10-2025-0064704 | A | 5/2025 |

* cited by examiner

DISPLAY DEVICE AND METHOD FOR FABRICATING THE SAME

CROSS-REFERENCE TO RELATED APPLICATION

The present application claims priority to and the benefit of Korean Patent Application No. 10-2023-0154059, filed on Nov. 9, 2023, in the Korean Intellectual Property Office, the entire disclosure of which is incorporated by reference herein.

BACKGROUND

1. Field

The present disclosure relates to a display device and a method of manufacturing the same.

2. Description of the Related Art

With the development of the information society, the demand for display devices for displaying images is increasing in various forms. The display device may be a flat panel display such as a liquid crystal display, a field emission display, a light emitting display, and/or the like. The light emitting display device may include an organic light emitting display device including an organic light emitting diode element as a light emitting element, and a miniature light emitting display device including a micro light emitting diode element (hereinafter referred to as a micro light emitting element) as a light emitting element.

When manufacturing a micro light emitting display device, the micro light emitting element must be bonded to the pixel electrode and the common electrode of the display panel, but the micro light emitting element may not be connected to the pixel electrode and the common electrode due to misalignment of the micro light-emitting element. Poor bonding between the micro light emitting element and the pixel electrode and common electrode may cause the micro light emitting element to be non light-emitting.

SUMMARY

Aspects and features of embodiments of the present disclosure provide a display device and a method of manufacturing the same that may reduce or prevent the failure of the micro light emitting element to be electrically connected to a pixel electrode and/or a common electrode due to misalignment or the like.

However, aspects and features of embodiments of the present disclosure are not limited to the one set forth herein. The above and other aspects and features of embodiments of the present disclosure will become more apparent to one of ordinary skill in the art to which the present disclosure pertains by referencing the detailed description of the present disclosure given below.

According to one or more embodiments, a display device includes a substrate, a common electrode and a pixel electrode spaced from each other on the substrate, a bank having an opening exposing a portion of the pixel electrode and the common electrode, a first reflective electrode on a top surface of the bank along the opening on a top surface of the pixel electrode, and a second reflective electrode on a top surface of the bank along the opening on a top surface of the common electrode, an organic pattern layer on the pixel electrode and the common electrode in the opening, a light emitting element on the organic pattern layer and including a first contact electrode and a second contact electrode on a top surface, a first via layer having a height that is less than that of the light emitting element, a lower connection electrode on the first via layer and connecting the second contact electrode and the second reflective electrode, a second via layer on the first via layer and the lower connection electrode and an upper connection electrode on the second via layer and connecting the first contact electrode and the first reflective electrode.

In one or more embodiments, an area of the lower connection electrode and an area of the upper connection electrode are each larger than an area of the light emitting element.

In one or more embodiments, an area of the lower connection electrode is larger than an area of the common electrode.

In one or more embodiments, the first via layer includes a first connection hole that overlaps the bank and exposes the first reflective electrode, and a second connection hole that overlaps the bank and exposes the second reflective electrode, wherein a third semiconductor layer of the light emitting element is in contact with the organic pattern layer, and wherein the second via layer includes a third connection hole that overlaps the first connection hole and exposes the first reflective electrode.

In one or more embodiments, the lower connection electrode extends along the first via layer on the second contact electrode and contacts the second reflective electrode through the second connection hole, wherein the upper connection electrode extends along the second via layer on the first contact electrode and contacts the first reflective electrode through the third connection hole and the first connection hole.

In one or more embodiments, the common electrode, the lower connection electrode, and the upper connection electrode overlap in a thickness direction in an area where a second connection hole is located.

In one or more embodiments, the second contact electrode overlaps the upper connecting electrode, the second via layer, and the lower connecting electrode in a thickness direction.

In one or more embodiments, the first reflective electrode and the second reflective electrode are spaced from each other.

In one or more embodiments, the light emitting element further includes a third semiconductor layer, a second semiconductor layer, an active layer, a first semiconductor layer, and a protective layer, wherein the third semiconductor layer is in contact with the organic pattern layer, and wherein the protective layer is on a surface of the light emitting element in its entirety except for bottom of the light emitting element and has an opening exposing the first contact electrode and the second contact electrode on the top surface of the light emitting element.

In one or more embodiments, a width of the organic pattern layer is wider than a greater of the light emitting element.

In one or more embodiments, the display device further includes a light blocking layer on the upper connection electrode, overlapping the bank, and defining a light emitting area, and a wavelength conversion layer in a space between light blocking layers.

In one or more embodiments, the display device further includes a capping layer, an overcoat layer, and a color filter layer sequentially located on the wavelength conversion layer and the light blocking layer.

According to one or more embodiments, a display device includes a substrate, a common electrode and a pixel electrode spaced from each other on the substrate, an organic pattern layer on the pixel electrode and the common electrode, a light emitting element on the organic pattern layer and having a first contact electrode and a second contact electrode on a top surface, a first via layer having a height that is less than that of the light emitting element, a lower connection electrode on the first via layer and connecting the second contact electrode and the common electrode, a second via layer on the first via layer and the lower connection electrode and an upper connection electrode on the second via layer and connecting the first contact electrode and the pixel electrode.

In one or more embodiments, an area of the lower connection electrode and an area of the upper connection electrode are larger than an area of the light emitting element.

In one or more embodiments, an area of the lower connection electrode is larger than an area of the common electrode.

In one or more embodiments, the first via layer includes a first connection hole exposing the pixel electrode and a second connection hole exposing the common electrode, wherein the second via layer includes a third connection hole that overlaps the first connection hole and exposes the pixel electrode.

In one or more embodiments, the lower connection electrode extends along the first via layer on the second contact electrode and contacts the common electrode through the second connection hole, wherein the upper connection electrode extends along the second via layer on the first contact electrode and contacts the pixel electrode through the third connection hole and the first connection hole.

According to one or more embodiments, a method of manufacturing display device includes preparing a substrate on which a pixel electrode and a common electrode spaced from each other are located, forming a bank having an opening exposing a portion of the pixel electrode and the common electrode, forming a first reflective electrode on a top surface of the bank along the opening on a top surface of the pixel electrode, and a second reflective electrode on a top surface of the bank along the opening on a top surface of the common electrode, forming an organic pattern layer covering edges of the first reflective electrode and the second reflective electrode, and bonding a light emitting element on the organic pattern layer, forming a first via layer at a lower height than the light emitting element, and forming a lower connection electrode on the first via layer to connect a second contact electrode on a top surface of the light emitting element and the second reflective electrode and forming a second via layer on the first via layer and the lower connection electrode and forming an upper connection electrode connecting a first contact electrode on the top surface of the light emitting element and the first reflective electrode on the second via layer.

In one or more embodiments, wherein in the forming the first via layer at the lower height than the light emitting element and forming the lower connection electrode on the first via layer to connect the second contact electrode on the top surface of the light emitting element and the second reflective electrode, the forming a second connection hole overlapping the bank through the first via layer, and wherein the lower connection electrode extends along the first via layer on the second contact electrode to connect the second reflective electrode through a second connection hole.

In one or more embodiments, in the forming the second via layer on the first via layer and the lower connection electrode and forming the upper connection electrode connects the first contact electrode on the top surface of the light emitting element and the first reflective electrode on the second via layer, the forming a first connection hole overlapping the bank penetrating the first via layer and a third connection hole overlapping a first connection hole penetrating the second via layer, and the upper connection electrode extending along the second via layer on the first contact electrode and contacting the first reflective electrode through the third connection hole and the first connection hole.

According to a display device and a manufacturing method thereof according to one or more embodiments, by the connection electrode of the pixel electrode and the connection electrode of the light emitting element are formed in different layers, the area of the connection electrode may be enlarged so that it may be contacted even with a misaligned light-emitting element. Therefore, even if the light emitting element is misaligned, failure to be electrically connected to the pixel electrode and/or the common electrode may be reduced or prevented.

However, the effects, aspects, and features of the present disclosure are not limited to the aforementioned effects, aspects, and features and various other effects, aspects, and features are included in the present disclosure.

BRIEF DESCRIPTION OF DRAWINGS

The above and other aspects and features of the present disclosure will become more apparent by describing in detail embodiments thereof with reference to the attached drawings.

DETAILED DESCRIPTION

Figure 1:
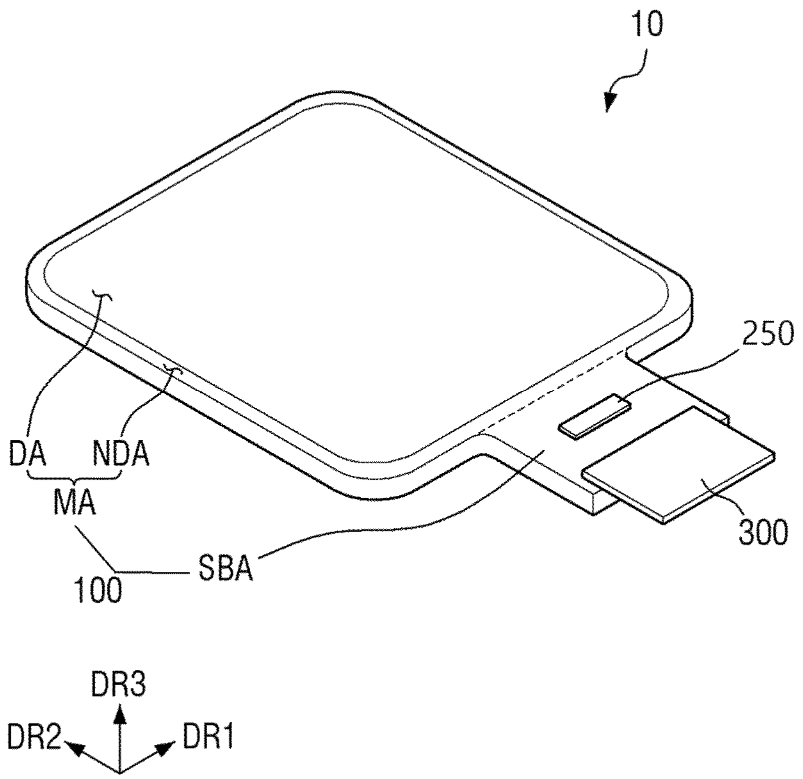
FIG. 1 is a perspective view illustrating a display device according to one or more embodiments.

Embodiments will now be described more fully hereinafter with reference to the accompanying drawings. The embodiments may, however, be provided in different forms and should not be construed as limiting. The same reference numbers indicate the same components throughout the present disclosure. In the accompanying figures, the thickness of layers and regions may be exaggerated for clarity.

Some of the parts which are not associated with the description may not be provided in order to describe embodiments of the present disclosure.

It will also be understood that when a layer is referred to as being "on" another layer or substrate, it can be directly on the other layer or substrate, or intervening layers may also be present. In contrast, when an element is referred to as being "directly on" another element, there may be no intervening elements present.

Further, the phrase "in a plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. The expression "not overlap" may include meaning such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

The spatially relative terms "below," "beneath," "lower," "above," "upper," or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

When an element is referred to as being "connected" or "coupled" to another element, the element may be "directly connected" or "directly coupled" to another element, or "electrically connected" or "electrically coupled" to another element with one or more intervening elements interposed therebetween. It will be further understood that when the terms "comprises," "comprising," "has," "have," "having," "includes" and/or "including" are used, they may specify the presence of stated features, integers, steps, operations, elements and/or components, but do not preclude the presence or addition of other features, integers, steps, operations, elements, components, and/or any combination thereof.

It will be understood that, although the terms "first," "second," "third," or the like may be used herein to describe various elements, these elements should not be limited by these terms. These terms are used to distinguish one element from another element or for the convenience of description and explanation thereof. For example, when "a first element" is discussed in the description, it may be termed "a second element" or "a third element," and "a second element" and "a third element" may be termed in a similar manner without departing from the teachings herein.

The terms "about" or "approximately" as used herein is inclusive of the stated value and means within an acceptable range of deviation for the particular value as determined by one of ordinary skill in the art, considering the measurement in question and the error associated with measurement of the particular quantity (for example, the limitations of the measurement system). For example, "about" may mean within one or more standard deviations, or within ±30%, 20%, 10%, 5% of the stated value.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

Unless otherwise defined or implied, all terms used herein (including technical and scientific terms) have the same meaning as commonly understood by those skilled in the art to which the present disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present disclosure.

Hereinafter, embodiments of the present disclosure will be described in detail with reference to the accompanying drawings.

FIG. 1 is a perspective view illustrating a display device according to one or more embodiments.

Referring to FIG. 1, a display device 10 is a device for displaying video and/or still images, such as mobile phones, smart phones, tablet personal computers, and portable electronic devices such as smart watches, watch phones, mobile communication terminals, electronic notebooks, e-books, portable multimedia players (PMP), navigation device, and/or ultra mobile PCs (UMPC), as well as display screens for a variety of products such as televisions, laptops, monitors, billboards, and/or the internet of things (IoT) device.

The display device 10 may be a light emitting display device, such as an organic light-emitting display device utilizing an organic light-emitting diode (OLED), a quantum dot light-emitting display device including a quantum dot light-emitting layer, an inorganic light-emitting display device including an inorganic semiconductor, and a miniaturized light-emitting display device utilizing a micro or nano light emitting diode (micro LED or nano LED). Hereinafter, the description focuses on the fact that the display device 10 is a micro-light emitting display device, but the present disclosure is not limited thereto. On the other hand, a micro light emitting diode referred to as a light emitting diode in the following for convenience of explanation.

The display device 10 includes a display panel 100, a display driving circuit 250, and a circuit board 300.

The display panel 100 may be formed as a rectangular-shaped plane having a short side in the first direction DR1 and a long side in the second direction DR2 that intersects the first direction DR1. A corner where the short side in the first direction DR1 and the long side in the second direction DR2 meet may be rounded to have a suitable curvature (e.g., a predetermined curvature) or may be formed at a right angle. The planar shape of the display panel 100 is not limited to a rectangle, and may be formed in other polygonal, circular, or oval shapes. The display panel 100 may be formed flat but is not limited thereto. For example, the display panel 100 is formed at left and right ends and may include curved portions with a constant curvature or a changing curvature. Additionally, the display panel 100 may be formed to be flexible, such as to be able to be bent, curved, folded, and/or rolled.

The substrate SUB (see FIG. 7) of the display panel 100 may include a main area MA and a sub-area SBA.

The main area MA may include a display area DA that displays an image and a non-display area NDA that is a peripheral area of the display area DA and is around the display area DA along an edge or a periphery of the display area DA. The display area DA may include a plurality of pixels that display an image. For example, the pixel may include a first sub-pixel that emits first light, a second sub-pixel that emits second light, and a third sub-pixel that emits third light.

The sub-area SBA may protrude from one side of the main area MA in the second direction DR2. Although FIG. 1 illustrates the sub-area SBA being unfolded, the sub-area SBA may be bent, and in this case, may be disposed on the bottom surface of the display panel 100. When the sub-area SBA is bent, it may overlap the main area MA in the third direction DR3, which is the thickness direction of the display panel 100. The display driving circuit 250 may be disposed in the sub-area SBA.

The display driving circuit 250 may generate signals and voltages for driving the display panel 100. The display driving circuit 250 may be formed as an integrated circuit (IC) and attached to the display panel 100 using a chip on glass (COG) method, a chip on plastic (COP) method, or an ultrasonic bonding method but is not limited thereto. For example, the display driving circuit 250 may be attached to the circuit board 300 using a chip on film (COF) method.

The circuit board 300 may be attached to one end of the sub-area SBA of the display panel 100. As such, the circuit board 300 may be electrically connected to the display panel 100 and the display driving circuit 250. The display panel 100 and the display driving circuit 250 may receive digital video data, timing signals, and driving voltages through the circuit board 300. The circuit board 300 may be a flexible film, such as a flexible printed circuit board (FPCB), a printed circuit board (PCB), or a chip on film (COF).

Figure 2:
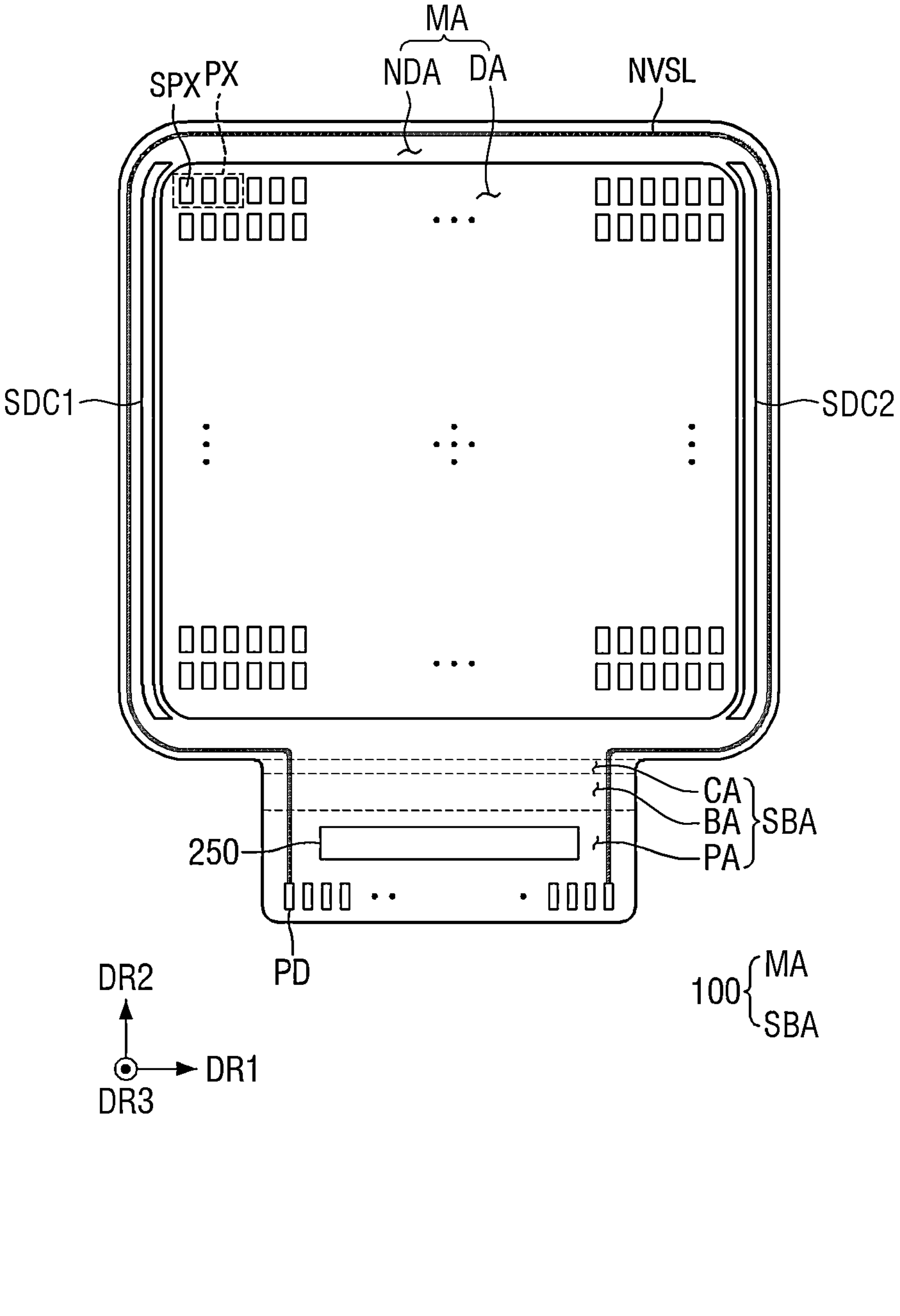
FIG. 2 is a layout diagram illustrating a display device according to one or more embodiments.

FIG. 2 is a layout diagram illustrating a display device according to one or more embodiments. FIG. 2 illustrates that the sub-area SBA is unfolded without being bent.

Referring to FIG. 2, the display panel 100 may include the main area MA and the sub-area SBA.

The main area MA may include the display area DA that displays an image and the non-display area NDA that is a peripheral area of the display area DA. The display area DA may occupy most of the main area MA. The display area DA may be placed in the center of the main area MA.

The display area DA may include a plurality of pixels PX for displaying an image, and each of the plurality of pixels PX may include a plurality of sub-pixels SPX. A pixel PX may be defined as a sub-pixel group of the smallest unit capable of expressing a white grayscale.

The non-display area NDA may be placed adjacent to the display area DA. The non-display area NDA may be an area outside the display area DA. The non-display area NDA may be arranged to be around (e.g., to surround) the display area DA. The non-display area NDA may be an edge area of the display panel 100.

A first scan driving unit (or first scan driving portion) SDC1 and a second scan driving unit (or second scan driving portion) SDC2 may be disposed in the non-display area NDA. The first scan driving unit SDC1 is disposed on one side (for example, the left side) of the display panel 100, and the second scan driving unit SDC2 is disposed on the other side (for example, the right side) of the display panel 100. However, it is not limited thereto. Each of the first scan driving unit SDC1 and the second scan driving unit SDC2 may be electrically connected to the display driving circuit 250 through scan fan-out lines. Each of the first scan driving unit SDC1 and the second scan driving unit SDC2 may receive a scan control signal from the display driving circuit 250, generate scan signals according to the scan control signal, and output them to the scan lines.

The sub-area SBA may protrude from one side of the main area MA in the second direction DR2. The length of the sub-area SBA in the second direction DR2 may be smaller than the length of the main area MA in the second direction DR2. The length in the first direction DR1 of the sub-area SBA is smaller than the length in the first direction DR1 of the main area MA or may be substantially equal to the length in the first direction DR1 of the main area MA. The sub-area SBA may be curved and may be disposed at the lower portion of the display panel 100. In this case, the sub-area SBA may overlap the main area MA in the third direction DR3.

The sub-area SBA may include a connection area CA, a pad area PA, and a bending area BA.

The connection area CA is an area protruding from one side of the main area MA in the second direction DR2. One side of the connection area CA may be in contact with the non-display area NDA of the main area MA, and the other side of the connection area CA may be in contact with the bending area BA.

The pad area PA is an area where the pads PD and the display driving circuit 250 are disposed. The display driving circuit 250 may be attached to the driving pads of the pad area PA using a conductive adhesive member such as an anisotropic conductive film. The circuit board 300 may be attached to the pads PD of the pad area PA using a conductive adhesive member such as an anisotropic conductive film. One side of the pad area PA may be in contact with the bending area BA.

The bending area BA is a bent area. When the bending area BA is bent, the pad area PA may be disposed below the connection area CA and below the main area MA. The bending area BA may be disposed between the connection area CA and the pad area PA. One side of the bending area BA may be in contact with the connection area CA, and the other side of the bending area BA may be in contact with the pad area PA.

A non-display power supply line NVSL may be disposed in the non-display area NDA, the connection area CA, the bending area BA, and the pad area PA.

The non-display power supply line NVSL may be disposed on four sides of the display area DA in the non-display area NDA. The non-display power supply line NVSL may be arranged to be around (e.g., to surround) at least three sides of the display area DA. For example, the non-display power supply line NVSL may be around (e.g., to surround) the left, top, and right sides of the display area DA and may be disposed on at least a portion of the lower side. Further, the non-display power supply line NVSL may be disposed outside a first scan driving portion SDC1 and outside a second scan driving portion SDC2. For example, the non-display power supply line NVSL may be disposed on the left side of the first scan driving portion SDC1 and on the right side of the second scan driving portion SDC2. The non-display power supply line NVSL may be disposed at the edge of the first scan driving portion SDC1 and the substrate SUB and at the edge of the second scan driving portion SDC2 and the substrate SUB. Alternatively, the non-display power supply line NVSL may overlap the first scan driving portion SDC1 and the second scan driving portion SDC2.

The non-display power supply line NVSL may be disposed at the left and right edges of the connection area CA and the bending area BA. The non-display power supply line NVSL may be connected to a pad PD adjacent to one side edge and a pad PD adjacent to the other side edge from among the pads PD in the pad area PA. The non-display power supply line NVSL may be supplied with a second driving voltage VSS (see FIG. 3) from a power supply circuit 500 (see FIG. 3) disposed on the circuit board 300.

Figure 3:
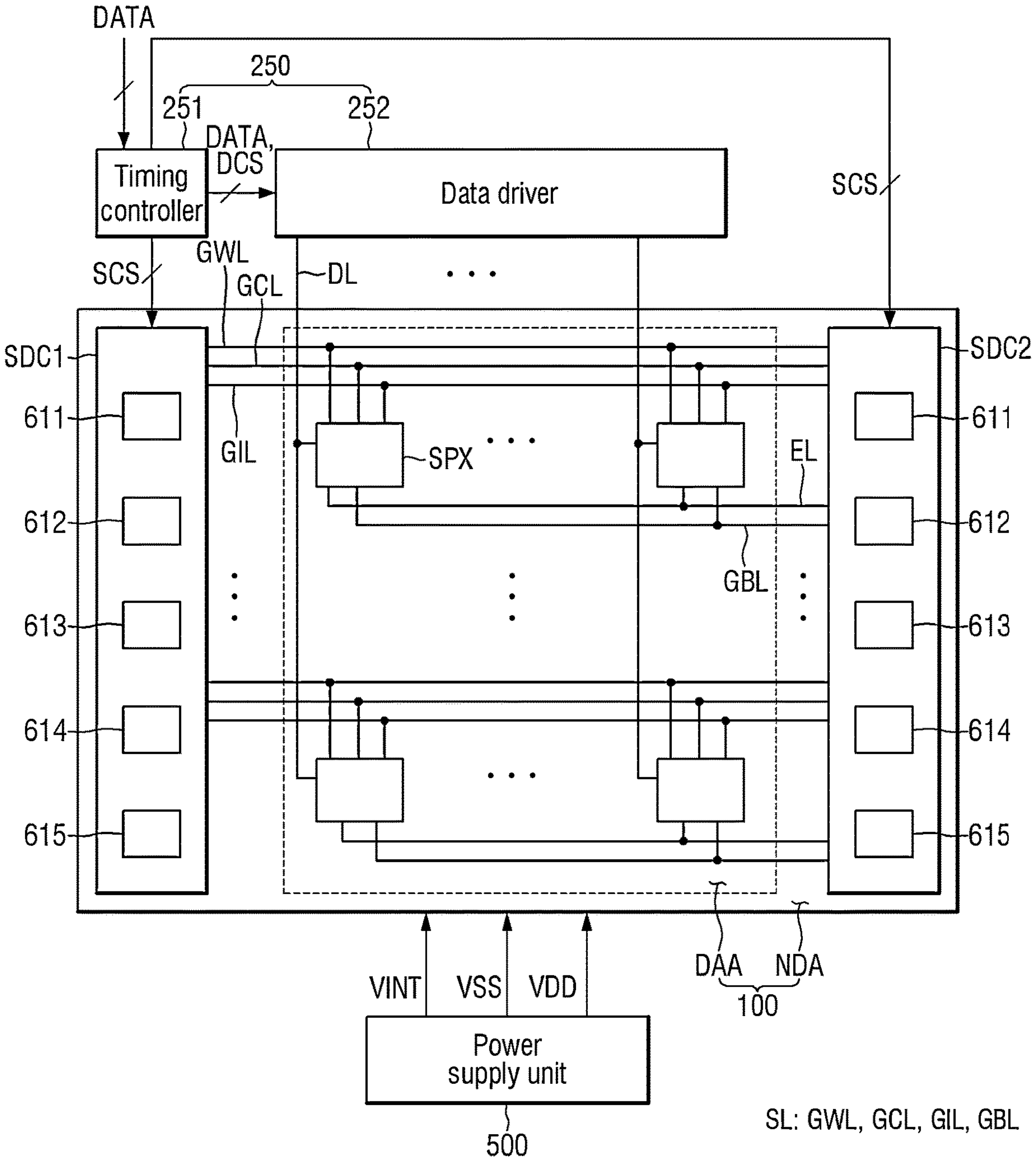
FIG. 3 is a block diagram illustrating a display device according to one or more embodiments.

FIG. 3 is a block diagram illustrating a display device according to one or more embodiments.

Referring to FIG. 3, the display area DA includes a plurality of pixels PX, a plurality of scan lines SL, a plurality of emission control lines EL, and a plurality of data lines DL.

The plurality of pixels PX may be arranged in a matrix form in the first direction DR1 and the second direction DR2. The plurality of pixels PX may be arranged along rows and columns of a matrix along the first direction DR1 and the second direction DR2. The plurality of scan lines SL and the plurality of emission control lines EL may extend in the first direction DR1 and be arranged along the second direction DR2. The plurality of data lines DL may extend in the second direction DR2 and be arranged along the first direction DR1. The plurality of scan lines SL may include a plurality of write scan lines GWL, a plurality of control scan lines GCL, a plurality of initialization scan lines GIL, and a plurality of bias scan lines GBL.

Each of the plurality of sub-pixels SPX may be connected to a write scan line GWL from among the plurality of write scan lines GWL, a control scan line GCL from among the plurality of control scan lines GCL, an initialization scan line GIL from among the plurality of initialization scan lines GIL, a bias scan line GBL from among the plurality of bias scan lines GBL, an emission control line EL from among the plurality of emission control lines EL, and a data line DL from among the plurality of data lines DL. Each of the plurality of sub-pixels SPX may be supplied with a data voltage of the data line DL according to the write scan signal of the write scan line GWL and may emit light from the light emitting elements according to the data voltage.

The non-display area NDA includes a first scan driving unit SDC1, a second scan driving unit SDC2, and a display driving circuit 250.

Each of the first scan driving unit SDC1 and the second scan driving unit SDC2 may include a write scan signal output unit 611, a control scan signal output unit 612, an initialization scan signal output unit 613, a bias scan signal output unit 614, and a light emitting signal output unit 615. Each of the write scan signal output unit 611, the control scan signal output unit 612, the initialization scan signal output unit 613, the bias scan signal output unit 614, and the light emitting signal output unit 615 may receive a scan timing control signal SCS from the timing control circuit 251. The write scan signal output unit 611 may generate write scan signals according to the scan timing control signal SCS of the timing control circuit 251 and sequentially output them to the write scan lines GWL. The control scan signal output unit 612 may generate control scan signals according to the scan timing control signal SCS and sequentially output them to the control scan lines GCL. The initialization scan signal output unit 613 may generate initialization scan signals according to the scan timing control signal SCS and sequentially output them to the initialization scan lines GIL. The bias scan signal output unit 614 may generate bias scan signals according to the scan timing control signal SCS and sequentially output them to the bias scan lines GBL. The light emitting signal output unit 615 may generate light emitting control signals according to the scan timing control signal SCS and sequentially output them to the emission control lines EL.

The display driving circuit 250 includes a timing control circuit 251 and a data driving circuit 252.

The data driving circuit 252 may receive digital video data DATA and a data timing control signal DCS from the timing control circuit 251. The data driving circuit 252 converts digital video data DATA into analog data voltages according to the data timing control signal DCS and outputs them to the data lines DL. In this case, the sub-pixels SPX are selected by the write scan signals of the first scan driving unit SDC1 and the second scan driving unit SDC2, and data voltages may be supplied to the selected sub-pixels SPX.

The timing control circuit 251 may receive digital video data DATA and timing signals from an external source. The timing control circuit 251 may generate the scan timing control signal SCS and the data timing control signal DCS to control the display panel 100 according to timing signals. The timing control circuit 251 may output the scan timing control signal SCS to the first scan driving unit SDC1 and the second scan driving unit SDC2. The timing control circuit 251 may output digital video data DATA and a data timing control signal DCS to the data driving circuit 252.

The power supply circuit 500 may generate a plurality of panel driving voltages according to an external power supply voltage. For example, the power supply circuit 500 may generate and supply a first driving voltage VDD, a second driving voltage VSS, and a third driving voltage VINT to the display panel 100.

Figure 4:
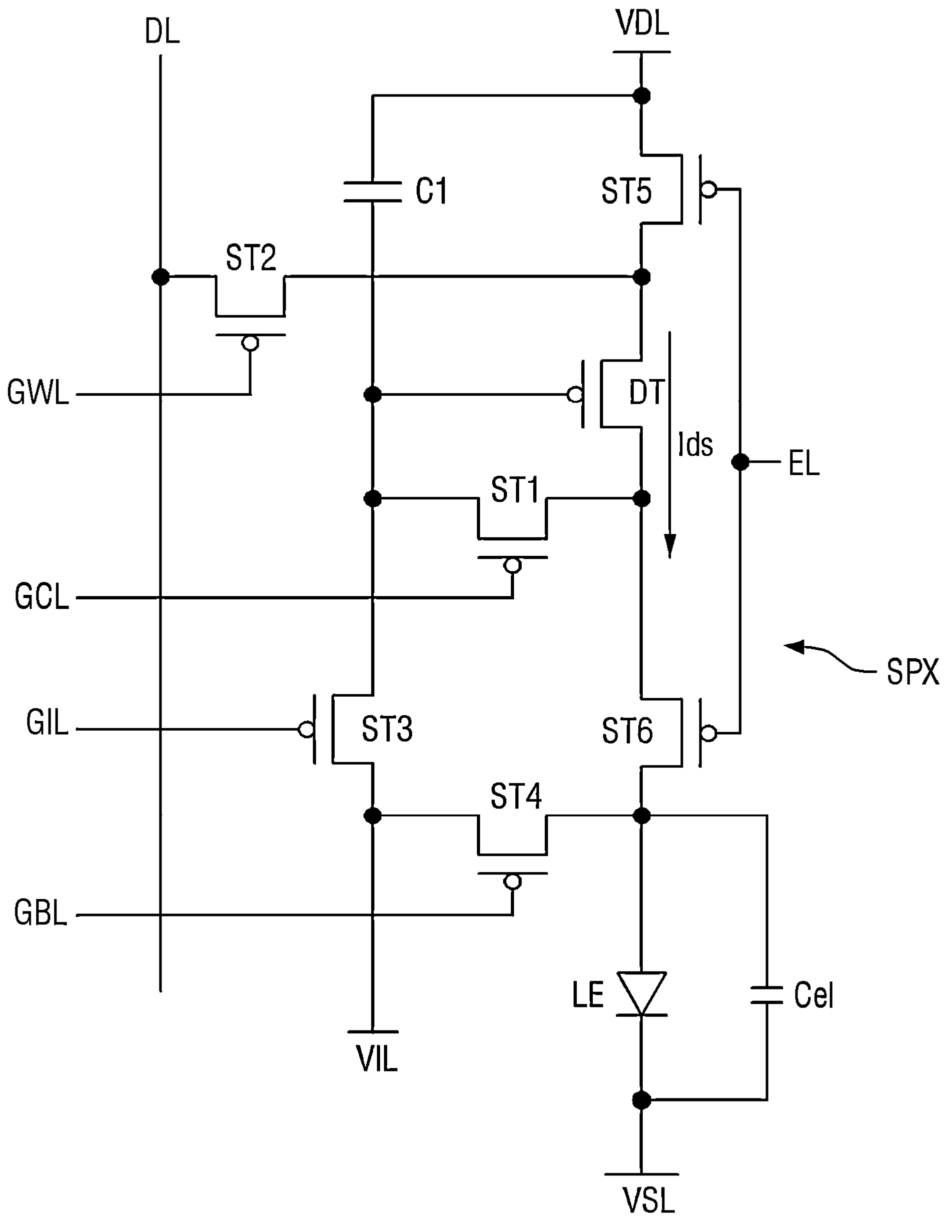
FIG. 4 is an equivalent circuit diagram illustrating a sub-pixel according to one or more embodiments.

FIG. 4 is an equivalent circuit diagram illustrating a sub-pixel according to one or more embodiments.

Referring to FIG. 4, the sub-pixel SPX according to one or more embodiments may be connected to scan lines GWL, GIL, GCL, and GBL, an emission control line EL, and a data line DL. For example, the sub-pixel SPX may be connected to the write scan line GWL, the initialization scan line GIL, the control scan line GCL, the bias scan line GBL, the emission control line EL, and the data line DL.

The sub-pixel SPX according to one or more embodiments includes a driving transistor DT, switch elements, a capacitor C1, and a light emitting element LE. The switch elements include first to sixth transistors ST1, ST2, ST3, ST4, ST5, and ST6.

The driving transistor DT includes a gate electrode, a first electrode, and a second electrode. The driving transistor DT controls the drain-source current Ids (hereinafter referred to as "driving current") flowing between the first electrode and the second electrode according to the data voltage applied to the gate electrode.

The light emitting element LE may be a micro light emitting diode.

The light emitting element LE emits light according to the driving current Ids. The amount of light emitted from the light emitting element LE may be proportional to the driving current Ids. The anode electrode of the light emitting element LE is connected to the first electrode of the fourth transistor ST4 and the second electrode of the sixth transistor ST6, and the cathode electrode may be connected to a second power supply line VSL to which a second power supply voltage is applied.

The capacitor C1 is formed between the gate electrode of the driving transistor DT and the first power supply line VDL to which the first power supply voltage is applied. The first power supply voltage may be at a higher level than the second power supply voltage. One electrode of the capacitor C1 may be connected to the gate electrode of the driving transistor DT, and the other electrode may be connected to the first power supply line VDL.

As shown in FIG. 4, the first to sixth transistors ST1, ST2, ST3, ST4, ST5, and ST6 and the driving transistor DT may all be formed as P-type metal oxide semiconductor field effect transistor (MOSFET). In this case, the active layer of each of the first to sixth transistors ST1, ST2, ST3, ST4, ST5, and ST6 and the driving transistor DT may be formed of polysilicon.

The gate electrode of the second transistor ST2 may be connected to the write scan line GWL, and the gate electrode of the first transistor ST1 may be connected to the control scan line GCL. The gate electrode of the third transistor ST3 may be connected to the initialization scan line GIL, and the gate electrode of the fourth transistor ST4 may be connected to the bias scan line GBL. The gate electrodes of the fifth and sixth transistor ST5 and ST6 may be connected to the emission control line EL. Because the first to sixth transistors ST1, ST2, ST3, ST4, ST5, and ST6 are formed as P-type MOSFET, they may be turned on when a scan signal of the gate low voltage and an emission signal of a low voltage are applied to the control scan line GCL, the initialization scan line GIL, the write scan line GWL, the bias scan line GBL, and the emission control line EL, respectively. One electrode of the third transistor ST3 and one electrode of the fourth transistor ST4 may be connected to an initialization voltage line VIL.

For example, the first transistor ST1 may be connected between the second electrode and the gate electrode of the driving transistor DT. The second transistor ST2 may be connected between the data line DL and the first electrode of the driving transistor DT. The third transistor ST3 may be connected between the initialization voltage line VIL and the gate electrode of the driving transistor DT. The fourth transistor ST4 may be connected between the initialization voltage line VIL and the light emitting element LE. The fifth transistor ST5 may be connected between the first power supply line VDL and the first electrode of the driving transistor DT. The sixth transistor ST6 may be connected between the second electrode of the driving transistor DT and the light emitting element LE. The parasitic capacitor Cel may be formed between the anode electrode and the cathode electrode of the light-emitting element LE.

Figure 5:
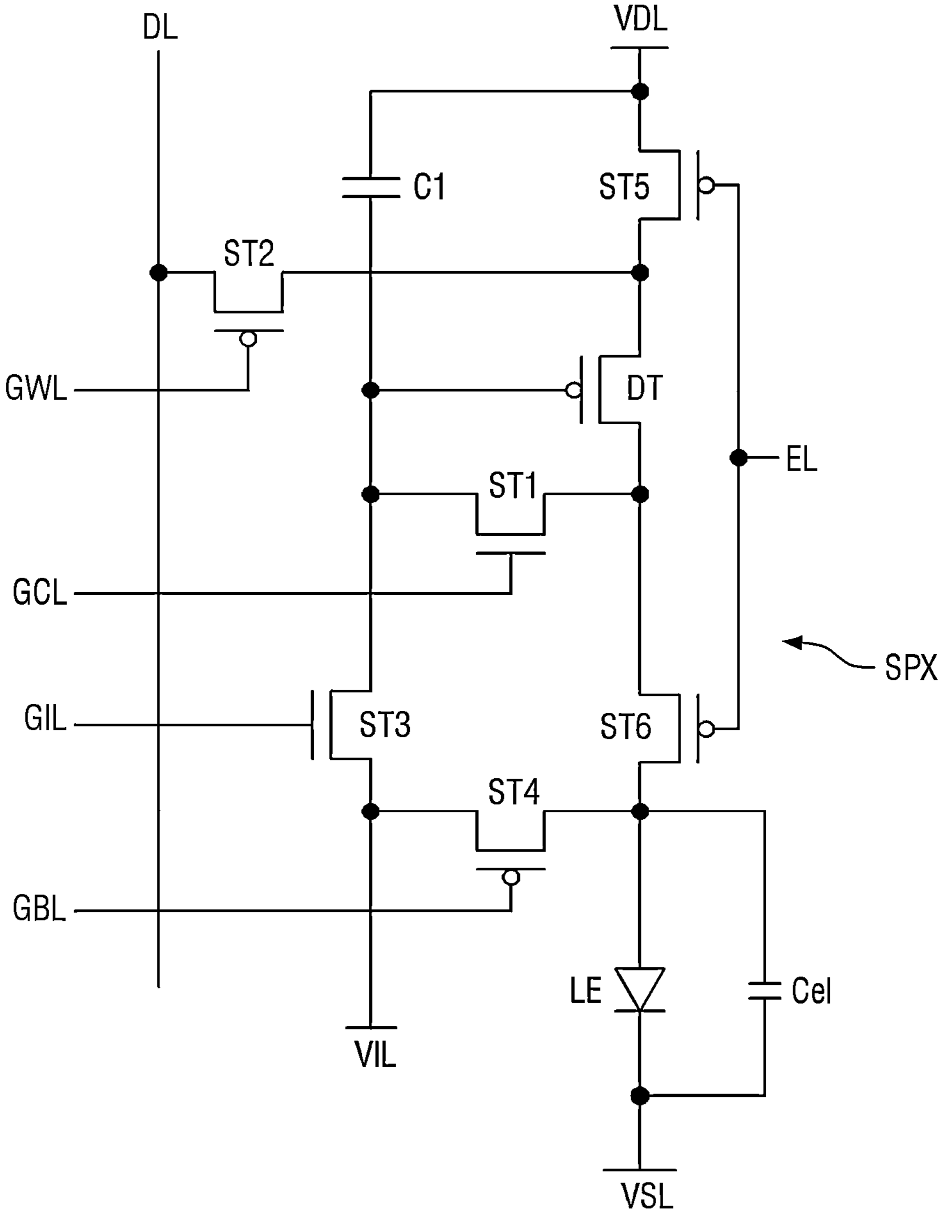
FIG. 5 is an equivalent circuit diagram illustrating a sub-pixel according to one or more embodiment.

FIG. 5 is an equivalent circuit diagram illustrating a sub-pixel according to one or more embodiments.

Referring to FIG. 5, the driving transistor DT, the second transistor ST2, the fourth transistor ST4, the fifth transistor ST5, and the sixth transistor ST6 are formed of P-type MOSFET, and the first transistor ST1 and the third transistor ST3 may be formed as N-type MOSFET. The active layer of each of the driving transistor DT, the second transistor ST2, the fourth transistor ST4, the fifth transistor ST5, and the sixth transistor ST6 formed as the P-type MOSFET may be formed of polysilicon, and the active layer of each of the first transistor ST1 and the third transistor ST3 formed as the N-type MOSFET may be formed of the oxide semiconductor. In this case, transistors formed of polysilicon and transistors formed of oxide semiconductors may be arranged in different layers.

Because the first transistor ST1 and the third transistor ST3 are formed as N-type MOSFET, the first transistor ST1 may be turned on when a control scan signal with a gate high voltage is applied to the control scan line GCL, and the third transistor ST3 may be turned on when an initialization scan signal is applied to the initialization scan line GIL. In comparison, the second transistor ST2, the fourth transistor ST4, the fifth transistor ST5, and the sixth transistor ST6 are formed as P-type MOSFET, so they may be turned on when a scan signal with a gate low voltage and an emission signal with a low voltage are applied to the write scan line GWL, the bias scan line GBL, and the emission control line EL, respectively.

Alternatively, the fourth transistor ST4 in FIG. 4 may be formed of the N-type MOSFET. In this case, the active layer of each fourth transistor ST4 may be formed of the oxide semiconductor. When the fourth transistor ST4 is formed of N-type MOSFET, it may be turned on when a bias scan signal of a gate high voltage is applied to the bias scan line GBL.

Alternatively, in one or more embodiments, the first to sixth transistors ST1, ST2, ST3, ST4, ST5, and ST6 and the driving transistor DT may all be formed as N-type MOSFET. In this case, the active layer of each of the first to sixth transistors ST1, ST2, ST3, ST4, ST5, and ST6 and the driving transistor DT may be formed of an oxide semiconductor.

Figure 6:
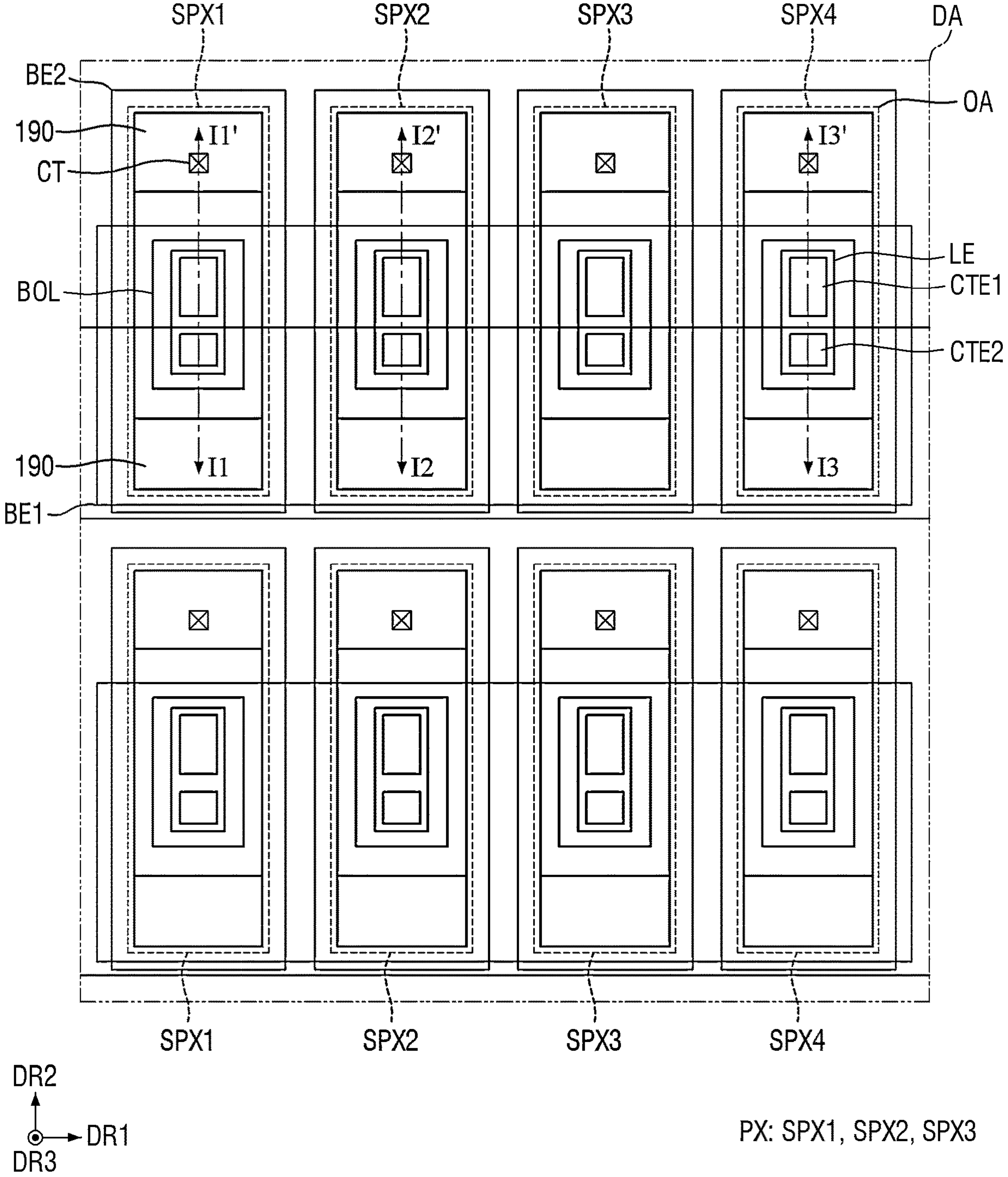
FIG. 6 is a layout diagram illustrating a plurality of pixels in a display area and a second power supply line, according to one or more embodiments.

FIG. 6 is a layout diagram illustrating a plurality of pixels in a display area and a second power supply line, according to one or more embodiments.

Referring to FIG. 6, each of the plurality of pixels PX in the display area DA may include a first sub-pixel SPX1, a second sub-pixel SPX2, a third sub-pixel SPX3, and fourth sub-pixel SPX4.

The plurality of pixels PX may be arranged in a matrix form. For example, the plurality of pixels PX may be arranged along rows and columns of a matrix. Each of the plurality of pixels PX disposed in the N (N is a positive integer) rows may be arranged in the first sub-pixel SPX1, the second sub-pixel SPX2, and the third sub-pixel SPX3, and the fourth sub-pixel SPX4. In each of the plurality of pixels PX arranged in the N+1 row, the first sub-pixel SPX1, the second sub-pixel SPX2, the third sub-pixel SPX3, and the fourth sub-pixel SPX4 may be arranged in the first direction DR1 in the above order.

The first sub-pixel SPX1 and the third sub-pixel SPX3 may emit light of a first color, the second sub-pixel SPX2 may emit light of a second color, and the fourth sub-pixel SPX4 may emit light of a third color. Here, the first color of light may be light in the green wavelength band, the second color of light may be light in the red wavelength band, and the third color of light may be light in the blue wavelength band. For example, the blue wavelength band may indicate that the main peak wavelength of the light is included in a wavelength band from approximately 370 μm to 460 μm, the green wavelength band may indicate that the main peak wavelength of the light is included in a wavelength band from approximately 480 μm to 560 μm, and the red wavelength band may indicate that the main peak wavelength of the light is included in a wavelength band from approximately 600 μm to 750 μm.

Each of the first to fourth sub-pixels SPX1 to SPX4 may include an opening OA, a pixel electrode PXE (see FIG. 7), a common electrode CE (see FIG. 7), a light emitting element LE, an organic pattern layer BOL, an upper connection electrode BE1, and a lower connection electrode BE2.

The opening OA may be defined as an area partitioned by the banks (190 in FIG. 8) in which the light emitting elements LE are disposed in each of the first to fourth sub-pixels SPX1 to SPX4.

The pixel electrode PXE and the common electrode CE may be arranged to be spaced from each other. A portion of the pixel electrode PXE may be disposed in a first portion of the opening OA, and the remaining portion may be disposed in an area other than the opening OA. A portion of the common electrode CE may be disposed in a second portion of the opening OA, and the remaining portion may be disposed in an area other than the opening OA. The pixel electrode PXE and the common electrode CE may have substantially the same area, but the present disclosure is not limited thereto.

The organic pattern layer BOL may be disposed to overlap the pixel electrode PXE and the common electrode CE in the opening OA. The organic pattern layer BOL serves to temporarily fix or adhere the light emitting element LE during the process of transferring the light emitting element LE to the display panel 100. That is, the organic pattern layer BOL may be a film for temporarily adhering the light emitting element LE to the pixel electrode PXE and the common electrode CE in the opening OA.

The area (or a width) of the organic pattern layer BOL may be larger than the area (or a width) of the light emitting element LE.

The light emitting element LE may have a rectangular planar shape. The light emitting element LE includes a first contact electrode CTE1 disposed on one side and a second contact electrode CTE2 disposed on the other side. The first contact electrode CTE1 and the second contact electrode CTE2 may be spaced from each other in the second direction DR2.

The first contact electrode CTE1 is in contact with the upper connection electrode BE1, and the second contact electrode CTE2 is in contact with the lower connection electrode BE2. The area of the upper connection electrode BE1 may be larger than the area of the pixel electrode PXE. The area of the lower connection electrode BE2 may be larger than the area of the common electrode CE.

The light emitting element LE may completely overlap the organic pattern layer BOL.

One end of the common electrode CE may be connected to the second power supply line (VSL in FIGS. 4 and 5). Each of the second power supply lines VSL may be electrically connected to the non-display power supply line NVSL disposed in the non-display area NDA as shown in FIG. 2.

Figure 7:
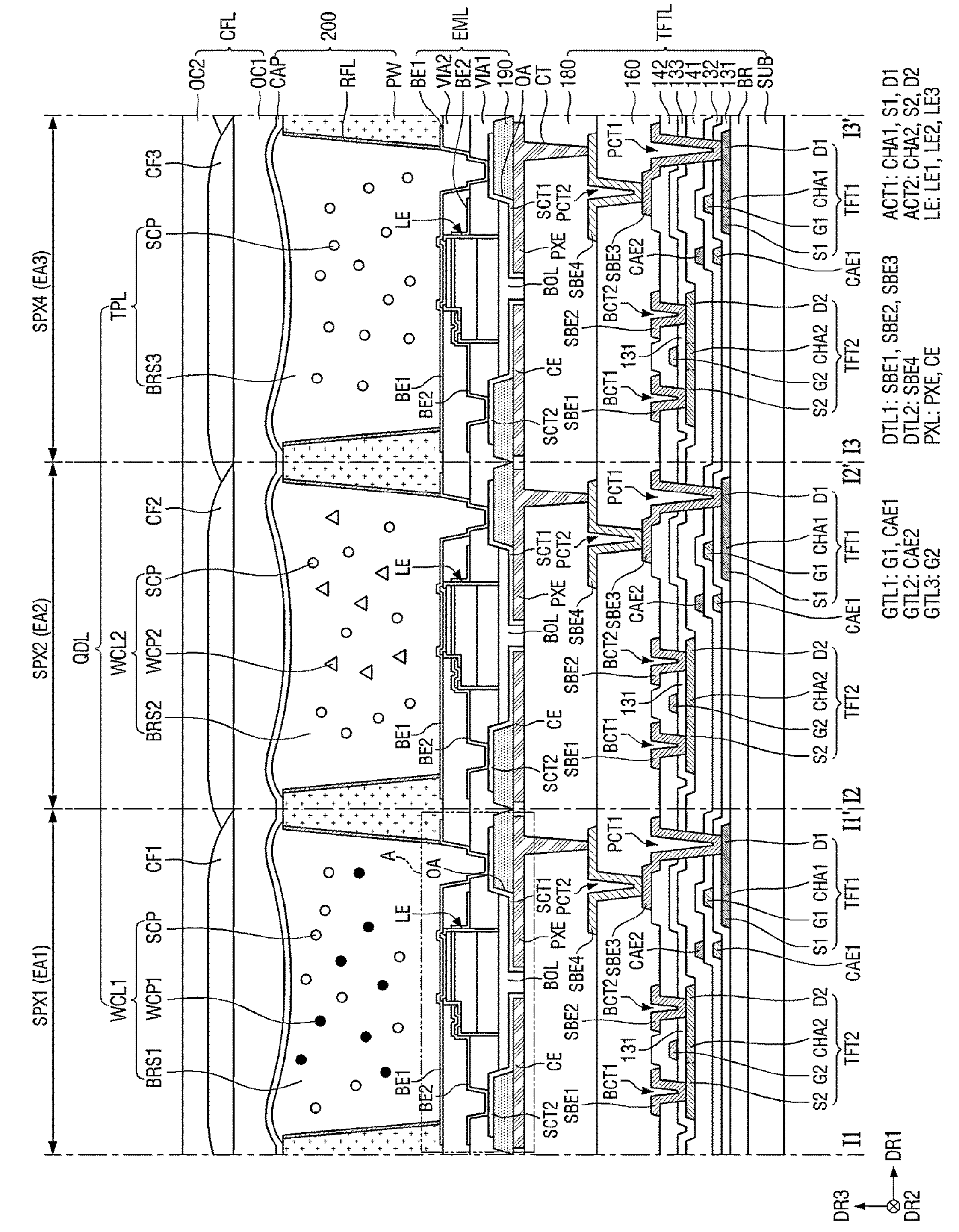
FIG. 7 is a cross-sectional view illustrating one example of a cross-section of the display panel corresponding to the lines I1-I1', I2-I2', and I3-I3' of FIG. 6.

A connection hole CT may be an area where the pixel electrode PXE is connected to a fourth source connection electrode (SBE4 in FIG. 7), which is electrically connected to the first source area S1 or the first drain area D1 of the first thin film transistor (TFT1 in FIG. 7). The connection holes CT may overlap with the pixel electrodes PXE.

Figure 8:
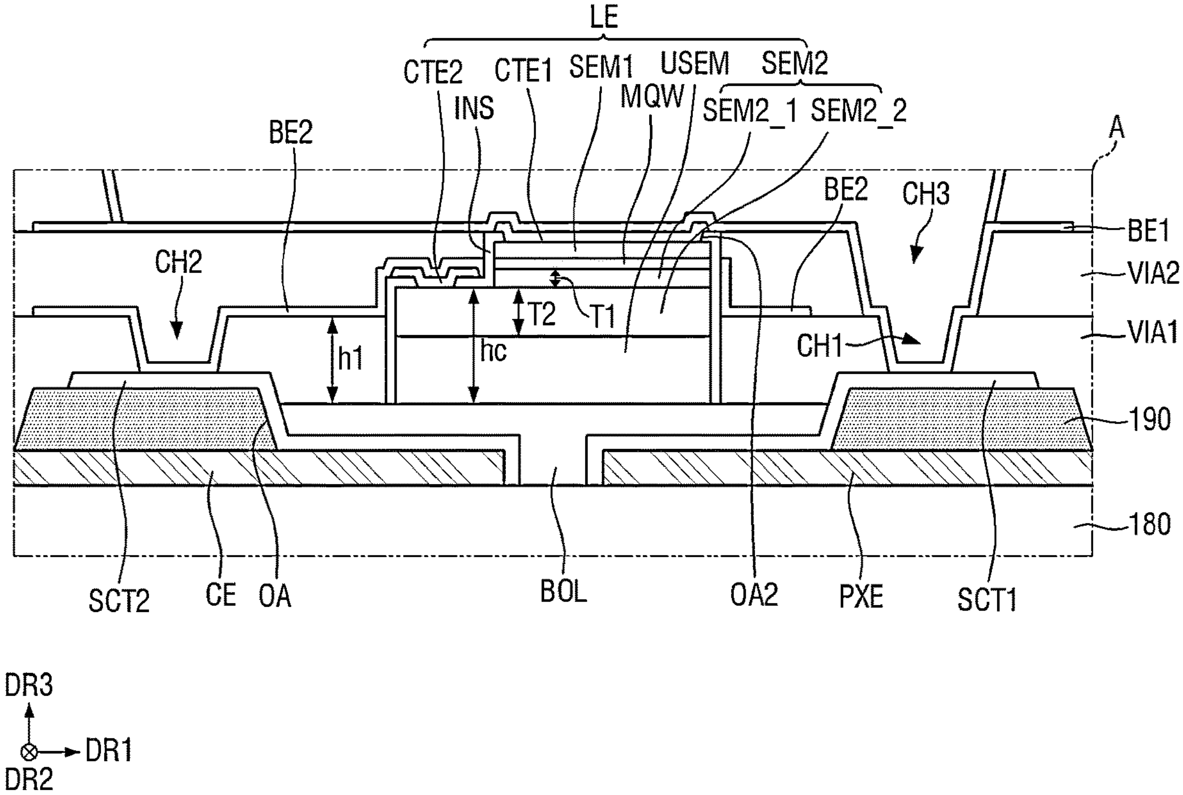
FIG. 8 is a cross-sectional view illustrating one example of a region A of FIG. 7 in detail.

FIG. 7 is a cross-sectional view illustrating one example of a cross-section of the display panel corresponding to the lines I1-I1', I2-I2', and I3-I3' of FIG. 6. FIG. 8 is a cross-sectional view illustrating one example of a region A of FIG. 7 in detail.

Referring to FIGS. 7 and 8, a substrate SUB may be made of an insulating material such as glass, polymer resin, and/or the like. If the substrate SUB is made of polymer resin, it may be a flexible substrate that may be stretched. The polymer resin may be acryl resin, epoxy resin, phenolic resin, polyamide resin, or polyimide resin.

A barrier film BR may be disposed on the substrate SUB. The barrier film BR is a membrane for protecting the transistors of a thin film transistor layer TFTL and the light emitting layer MQW of a light emitting element layer EML from moisture penetrating through the substrate SUB, which is vulnerable to moisture penetration. The barrier film BR may be composed of a plurality of inorganic films stacked alternately. For example, the barrier film BR may be formed as a multilayer of alternating inorganic films of one or more of a silicon nitride layer, a silicon oxynitride layer, a silicon oxide layer, a titanium oxide layer, and an aluminium oxide layer.

A first thin film transistor TFT1 may be disposed on the barrier film BR. The first thin film transistor TFT1 may be either the fourth transistor ST4 or the sixth transistor ST6 shown in FIG. 4. The first thin film transistor TFT1 may include a first active layer ACT1 and a first gate electrode G1.

The first active layer ACT1 of the first thin film transistor TFT1 may be disposed on the barrier film BR. The first active layer ACT1 of the first thin film transistor TFT1 may include polycrystalline silicon, single crystalline silicon, low-temperature polycrystalline silicon, and/or amorphous silicon.

The first active layer ACT1 may include a first channel area CHA1, a first source area S1, and a first drain area D1. The first channel area CHA1 may be an area overlapping the first gate electrode G1 in the third direction DR3, which is the thickness direction of the substrate SUB. The first source area S1 may be disposed on one side of the first channel area CHA1, and the first drain area D1 may be disposed on the other side of the first channel area CHA1. The first source area S1 and the first drain area D1 may be areas that do not overlap with the first gate electrode G1 in the third direction DR3. The first source area S1 and the first drain area D1 may be areas in which the silicon semiconductor is doped with ions to make it conductive.

A first gate insulating film 131 may be disposed on the first channel area CHA1, the first source area S1, and the first drain area D1 of the first thin film transistor TFT1 and the barrier film BR. The first gate insulating film 131 may be formed of an inorganic film, for example, a silicon nitride layer, a silicon oxynitride layer, a silicon oxide layer, a titanium oxide layer, and/or an aluminium oxide layer.

A first gate metal layer GTL1 may be disposed on the first gate insulating film 131. The first gate metal layer GTL1 may include the first gate electrode G1 of the first thin film transistor TFT1 and a first capacitor electrode CAE1. The first gate electrode G1 may overlap the first active layer ACT1 in the third direction DR3. In FIG. 7, the first gate electrode G1 and the first capacitor electrode CAE1 are shown to be spaced from each other, but the first gate electrode G1 and the first capacitor electrode CAE1 may be connected to each other. The first gate metal layer GTL1 may be formed as a single layer or multiple layers of any one of molybdenum (Mo), aluminium (Al), chromium (Cr), gold (Au), titanium (Ti), nickel (Ni), neodymium (Nd), and copper (Cu), and an alloy thereof.

A second gate insulating film 132 may be disposed on the first gate electrode G1 of the first thin film transistor TFT1, the first capacitor electrode CAE1, and the first gate insulating film 131. The second gate insulating film 132 may be formed of an inorganic film, for example, a silicon nitride layer, a silicon oxynitride layer, a silicon oxide layer, a titanium oxide layer, and/or an aluminium oxide layer.

A second gate metal layer GTL2 may be disposed on the second gate insulating film 132. The second gate metal layer GTL2 may include a second capacitor electrode CAE2. The second capacitor electrode CAE2 may overlap the first capacitor electrode CAE1 in the third direction DR3. Because the second gate insulating film 132 has a suitable permittivity (e.g., a predetermined permittivity), a capacitor (C1 in FIG. 5) may be formed by the first capacitor electrode CAE1, the second capacitor electrode CAE2, and the second gate insulating film 132 disposed between them. The second gate metal layer GTL2 may be formed as a single layer or multiple layers of any one of molybdenum (Mo), aluminium (Al), chromium (Cr), gold (Au), titanium (Ti), nickel (Ni), neodymium (Nd), and copper (Cu), and an alloy thereof.

A first interlayer insulating film 141 may be disposed on the second capacitor electrode CAE2 and the second gate insulating film 132. The first interlayer insulating film 141 may be formed of an inorganic film, such as a silicon nitride layer, a silicon oxynitride layer, a silicon oxide layer, a titanium oxide layer, and/or an aluminium oxide layer.

A second thin film transistor TFT2 may be disposed on the first interlayer insulating film 141. The second thin film transistor TFT2 may be either the first transistor ST1 or the third transistor ST3 shown in FIG. 5. The second thin film transistor TFT2 may include a second active layer ACT2 and a second gate electrode G2.

The second active layer ACT2 of the second thin film transistor TFT2 may be disposed on the first interlayer insulating film 141. The second active layer ACT2 may include an oxide semiconductor. For example, the second active layer ACT2 may include IGZO (indium (In), gallium (Ga), zinc (Zn) and oxygen (O)), IGZTO (indium (In), gallium (Ga), zinc (Zn), tin (Sn) and oxygen (O)), and/or IGTO (indium (In), gallium (Ga), tin (Sn), and oxygen (O)).

The second active layer ACT2 may include a second channel area CHA2, a second source area S2, and a second drain area D2. The second channel area CHA2 may be an area that overlaps the second gate electrode G2 in the third direction DR3. The second source area S2 may be disposed on one side of the second channel area CHA2, and the second drain area D2 may be disposed on the other side of the second channel area CHA2. The second source area S2 and the second drain area D2 may be areas that do not overlap the second gate electrode G2 in the third direction DR3. The second source area S2 and the second drain area D2 may be areas in which the oxide semiconductor is doped with ions to make it conductive.

A third gate insulating film 133 may be disposed on the second active layer ACT2 of the second thin film transistor TFT2 and the first interlayer insulating film 141. The third gate insulating film 133 may be formed of an inorganic film, for example, a silicon nitride layer, a silicon oxynitride layer, a silicon oxide layer, a titanium oxide layer, or an aluminium oxide layer.

A third gate metal layer GTL3 may be disposed on the third gate insulating film 133. The third gate metal layer GTL3 may include the second gate electrode G2 of the second thin film transistor TFT2. The second gate electrode G2 may overlap the second active layer ACT2 in the third direction DR3. The third gate metal layer GTL3 may be formed as a single layer or multiple layers of one of molybdenum (Mo), aluminium (Al), chromium (Cr), gold (Au), titanium (Ti), nickel (Ni), neodymium (Nd), and copper (Cu), and an alloy thereof.

A second interlayer insulating film 142 may be disposed on the second gate electrode G2 of the second thin film transistor TFT2 and the third gate insulating film 133. The second interlayer insulating film 142 may be formed of an inorganic film, for example, a silicon nitride layer, a silicon oxynitride layer, a silicon oxide layer, a titanium oxide layer, and/or an aluminium oxide layer.

A first data metal layer DTL1 may be disposed on the second interlayer insulating film 142. The first data metal layer DTL1 may include a first source connection electrode SBE3, a second source connection electrode SBE1, and a third source connection electrode SBE2. The first source connection electrode SBE3 may be connected to the first drain area D1 of the first active layer ACT1 through a first source contact hole PCT1 penetrating the first gate insulating film 131, the second gate insulating film 132, the first interlayer insulating film 141, the third gate insulating film 133, and the second interlayer insulating film 142. The second source connection electrode SBE1 may be connected to the second source area S2 of the second active layer ACT2 through a second source connection contact hole BCT1 penetrating the second interlayer insulating film 142 and the third gate insulating film 133. The third source connection electrode SBE2 may be connected to the second drain area D2 of the second active layer ACT2 through a third source connection contact hole BCT2 penetrating the second interlayer insulating film 142 and the third gate insulating film 133. The first data metal layer DTL1 may be formed as a single layer or multiple layers of any one of molybdenum (Mo), aluminium (Al), chromium (Cr), gold (Au), titanium (Ti), nickel (Ni), neodymium (Nd), and copper (Cu), and an alloy thereof. For example, the first data metal layer DTL1 may include a first layer made of titanium (Ti), a second layer made of aluminum (Al), and/or a third layer made of titanium (Ti).

A first organic layer 160 may be disposed to flatten the step due to the first thin film transistor TFT1 and the second thin film transistor TFT2 on the first source connection electrode SBE3, the second source connection electrode SBE1, and the third source connection electrode SBE2, and the second interlayer insulating film 142. The first organic layer 160 may be formed from an organic film such as acrylic resin, epoxy resin, phenolic resin, polyamide resin, polyimide resin, and/or the like.

A second data metal layer DTL2 may be disposed on the first organic layer 160. The second data metal layer DTL2 may include a fourth source connection electrode SBE4 and a second power supply line VSL. The fourth source connection electrode SBE4 may be connected to the first source connection electrode SBE3 through a second pixel connection hole PCT2 penetrating the first organic layer 160. The second data metal layer DTL2 may be formed as a single layer or multiple layers of any one of molybdenum (Mo), aluminium (Al), chromium (Cr), gold (Au), titanium (Ti), nickel (Ni), neodymium (Nd), and copper (Cu), and an alloy thereof. For example, the second data metal layer DTL2 may include a first layer made of titanium (Ti), a second layer made of aluminum (Al), and/or a third layer made of titanium (Ti).

The second organic layer 180 may be disposed on the second data metal layer DTL2 and the first organic layer 160. The second organic layer 180 may be formed of an organic layer such as acryl resin, epoxy resin, phenolic resin, polyamide resin, and/or polyimide resin. A light emitting element layer EML may be disposed on the second organic layer 180.

The light emitting element layer EML may further include pixel electrodes PXE, banks 190, light emitting elements LE, a common electrode CE, an organic pattern layer BOL, a first reflective electrode SCT1, a second reflective electrode SCT2, an upper connection electrode BE1, and a lower connection electrode BE2.

The pixel electrode PXE and the common electrode CE may be disposed on the second organic layer 180. The pixel electrode PXE and the common electrode CE may be spaced from each other.

The pixel electrode layer PXL may include the pixel electrode PXE, and the common electrode CE disposed respectively. The pixel electrode PXE may be referred to as an anode electrode, and the common electrode CE may be referred to as a cathode electrode.

The pixel electrode PXE may be connected to the fourth source connection electrode SBE4 through the connection hole CT penetrating the second organic layer 180. The pixel electrode PXE may be connected to the first source area S1 or the first drain area D1 of the first thin film transistor TFT1 through the first source connection electrode SBE3 and the fourth source connection electrode SBE4. Therefore, the voltage controlled by the first thin film transistor TFT1 may be applied to the pixel electrode PXE.

The common electrode CE may be commonly connected to neighboring sub-pixels. One end of the common electrode CE may be connected to the second power supply line (VSL in FIG. 4 or 5). Therefore, the second driving voltage VSS may be applied to the common electrode CE.

The pixel electrode layer PXL may be formed as a single layer or multiple layers of one of molybdenum (Mo), aluminium (Al), silver (Ag), platinum (Pt), palladium (Pd), chromium (Cr), gold (Au), titanium (Ti), nickel (Ni), neodymium (Nd), and copper (Cu), and an alloy thereof. When the pixel electrode layer PXL is made of a highly reflective metal material such as aluminum (Al), light emitted from the active layer MQW of the light emitting element LE that proceeds in the downward direction of the light emitting element LE may be reflected from the pixel electrode PXE and the common electrode CE and proceed in the upward direction of the light emitting element LE. Therefore, because the light loss from the light emitting element LE may be reduced, the light efficiency of the light emitting element LE may be increased.

The bank 190 may be disposed on the second organic layer 180, the pixel electrode PXE and the common electrode CE. The bank 190 is not formed on the entire surface of the second organic layer 180 and may include an opening OA to expose at least a portion of the pixel electrode PXE and the common electrode CE. For example, the bank 190 may be formed to cover the edges of the pixel electrode PXE and the common electrode CE. The opening OA may be an area partitioned by the bank 190. The opening OA may be an area where the bank 190 is not disposed and the pixel electrode PXE, the common electrode CE, and the second organic layer 180 are exposed.

The bank 190 may be formed of an organic layer such as acrylic resin, epoxy resin, phenolic resin, polyamide resin, and/or polyimide resin. The bank 190 may include a light blocking material to prevent light from the light emitting element LE of one sub-pixel from proceeding to the neighboring sub-pixel. For example, the bank 190 may include an inorganic black pigment such as carbon black and/or an organic black pigment.

The first reflective electrode SCT1 may be disposed on the side and top surfaces of the pixel electrode PXE and extend to the side and top surfaces of the bank 190. The second reflective electrode SCT2 may be disposed on the side and top surfaces of the common electrode CE and extend to the side and top surfaces of the bank 190. The first reflective electrode SCT1 and the second reflective electrode SCT2 may be spaced from each other.

The first reflective electrode SCT1 and the second reflective electrode SCT2 may include a metal material with a high light reflectance. For example, the first reflective electrode SCT1 and the second reflective electrode SCT2 may include aluminum or silver or may be an alloy thereof. The first reflective electrode SCT1 and the second reflective electrode SCT2 may be formed as a single layer but may also be formed as a multilayer. For example, the first reflective electrode SCT1 and the second reflective electrode SCT2 may be formed of a multilayer structure of ITO/Ag/ITO. The ITO/Ag/ITO of the first reflective electrode SCT1 and the second reflective electrode SCT2 may be formed to a thickness of 50 Å/850 Å/115 Å, respectively but are not limited thereto.

The organic pattern layer BOL may be disposed in the opening OA of the bank 190. The organic pattern layer BOL may cover the edges of the first reflective electrode SCT1 and the second reflective electrode SCT2. The organic pattern layer BOL may overlap at least a portion of the pixel electrode PXE and the common electrode CE.

The organic pattern layer BOL may be disposed in an island pattern shape in each light emitting area EA1, EA2, and EA3. For example, the organic pattern layer BOL disposed in each light emitting area EA1, EA2, and EA3 may be spaced from the organic pattern layer BOL disposed in the adjacent light emitting area EA1, EA2, and EA3.

The organic pattern layer BOL serves to temporarily fix or adhere the light emitting element LE during the process of transferring the light emitting element LE to the display panel 100. That is, the organic pattern layer BOL may be a film for temporarily adhering the light emitting element LE on the pixel electrode PXE and the common electrode CE. Because a larger thickness of the organic patterned layer BOL facilitates temporary adhesion, the height of the opening OA in which the organic patterned layer BOL is received or the thickness of the bank 190 may be 0.5 μm or more. The height of the opening OA may be greater than the thickness of the organic pattern layer BOL. The thickness of the organic pattern layer BOL may be greater than the thickness of the pixel electrode PXE. The organic pattern layer BOL may be in contact with the bottom surface of the light emitting element LE. Further, the organic pattern layer BOL may be in contact with at least a portion of each side of the light emitting element LE.

The organic pattern layer BOL may be a photosensitive organic layer such as photoresist. Alternatively, the organic pattern layer BOL may be formed from an acrylic resin, an epoxy resin, a phenolic resin, a polyamide resin, a polyimide resin, and/or the like.

In a high-resolution display panel, such as the display device 10 in one or more embodiments, it is difficult to replace the organic pattern layer BOL with an anisotropic conductive film (ACF).

The light emitting element LE may be disposed on the organic pattern layer BOL. The first contact electrode CTE1 and the second contact electrode CTE2 both protrude from the top surface of the light emitting element LE, and a lateral type micro LED is shown in the drawings as an example in which current flows in the lateral direction.

Each of the plurality of light emitting elements LE may be formed of an inorganic material such as gallium nitride (GaN). Each of the plurality of light emitting elements LE may have a length of several to hundreds of μm in the first direction DR1, a length in the second direction DR2, and a length in the third direction DR3. For example, each of the plurality of light emitting elements LE may have a length in the first direction DR1, a length in the second direction DR2, and a length in the third direction DR3 of approximately 100 μm or less.

The plurality of light emitting elements LE may be formed by growing on a semiconductor substrate such as a silicon substrate and/or sapphire substrate. The plurality of light emitting elements LE may be directly transferred from the semiconductor substrate to the organic pattern layer BOL of the display panel 100. Alternatively, the plurality of light emitting elements LE may be transferred to the organic pattern layer BOL of the display panel 100 through an electrostatic method using an electrostatic head or a stamp method using an elastic polymer material such as PDMS and/or silicone as a transfer substrate.

Each of the plurality of light emitting elements LE includes a first contact electrode CTE1, a second contact electrode CTE2, a first semiconductor layer SEM1, an active layer MQW, a second semiconductor layer SEM2, and an undoped semiconductor layer (or third semiconductor layer) USEM.

The undoped semiconductor layer USEM may be disposed on the organic pattern layer BOL. The undoped semiconductor layer USEM may be formed as a semiconductor layer that is not doped with an N-type dopant or a P-type dopant, that is, an undoped semiconductor layer. For example, the undoped semiconductor layer USEM may be one of InAlGaN, GaN, AlGaN, InGaN, AlN, and InN, where the dopant is not doped. For example, the undoped semiconductor layer USEM may be GaN that is not doped with a dopant.

The second semiconductor layer SEM2 may be disposed on the undoped semiconductor layer USEM. The second semiconductor layer SEM2 may be one of InAlGaN, GaN, AlGaN, InGaN, AlN, and InN doped with N-type dopants such as Si, Ge, Se, Sn, and/or the like. For example, the second semiconductor layer SEM2 may be N—GaN doped with N-type Si. The second semiconductor layer SEM2 may include a first portion SEM2_1 having a first thickness T1 and a second portion SEM2_2 having a second thickness T2 greater than the first thickness T1.

The active layer MQW may be disposed on the first portion SEM2_1 of the second semiconductor layer SEM2. The active layer MQW may emit light by combining electron-hole pairs according to an electrical signal applied through the first semiconductor layer SEM1 and the second semiconductor layer SEM2.

The active layer MQW may include a material having a single or multi-quantum well structure. When the active layer MQW includes a material having a multi-quantum well structure, it may have a structure in which a plurality of well layers and/or barrier layers are alternately stacked. In this case, the well layer may be formed of InGaN, and the barrier layer may be formed of GaN and/or AlGaN but is not limited thereto. Alternatively, the active layer MQW may have a structure in which semiconductor materials having a high energy band gap and semiconductor materials having a low energy band gap are alternately stacked with each other, may include other Group III to V semiconductor materials according to the wavelength range of emitted light.

When the active layer MQW includes InGaN, the color of the emitted light may vary depending on the indium (In) content. For example, as the content of indium (In) increases, the wavelength band of light emitted by the active layer MQW may shift to the red wavelength band, and as the content of indium (In) decreases, the wavelength band of light emitted by the active layer MQW may shift to the blue wavelength band. For example, the indium (In) content of the active layer MQW of the light emitting element LE that emits the third light (e.g., light in the blue wavelength band) may be approximately 10 wt % to 20 wt %.

The first semiconductor layer SEM1 may be disposed on the active layer MQW. The first semiconductor layer SEM1 may be one of InAlGaN, GaN, AlGaN, InGaN, AlN, and InN doped with P-type dopants such as Mg, Zn, Ca, Ba, and the like. For example, the first semiconductor layer SEM1 may be P—GaN doped with P-type Mg.

The first contact electrode CTE1 may be disposed on at least a portion of the first semiconductor layer SEM1. The first contact electrode CTE1 may include one of molybdenum (Mo), aluminium (Al), chromium (Cr), gold (Au), titanium (Ti), nickel (Ni), neodymium (Nd), and copper (Cu).

The second contact electrode CTE2 may be disposed on at least a portion of the second semiconductor layer SEM2.

An electron blocking layer may be disposed between the first semiconductor layer SEM1 and the active layer MQW. The electron blocking layer may be a layer to suppress or prevent too many electrons from flowing into the active layer MQW. For example, the electron blocking layer may be AlGaN and/or P—AlGaN doped with P-type Mg. The electronic blocking layer may be omitted.

A superlattice layer may be disposed between the active layer MQW and the second semiconductor layer SEM2. The superlattice layer may be a layer for relieving stress between the second semiconductor layer SEM2 and the active layer MQW. For example, the superlattice layer may be formed of InGaN and/or GaN. The superlattice layer may be omitted.

The light emitting element LE may further include a protective layer INS to protect the outer surface (e.g., the outer peripheral or circumferential surface). The protective layer INS may be disposed on the surface of the light emitting element LE except for the lower portion of the light emitting element LE. However, the protective layer INS has an opening that exposes a portion of the first contact electrode CTE1 and the second contact electrode CTE2. The first contact electrode CTE1 and the second contact electrode CTE2 exposed by the opening are in contact with the upper connection electrode BE1 and the lower connection electrode BE2, respectively. The protective layer INS may be formed of an inorganic film, such as a silicon nitride layer, a silicon oxynitride layer, a silicon oxide layer, a titanium oxide layer, and/or an aluminium oxide layer.

The first via layer VIA1 is disposed at a first height h1 to support the lower connection electrode BE2 and flatten the step formed by the light emitting element LE. The first height h1 of the first via layer VIA1 may be formed to be lower than that of the light emitting element LE. For example, the first via layer VIA1 having a height that is less than that of the light emitting element LE. The height of the first via layer VIA1 may be lower than the height of the active layer MQW. The first height h1 of the first via layer VIA1 may be a height that exposes both the first contact electrode CTE1 and the second contact electrode CTE2. The first height h1 may be lower than the height hc of the second contact electrode CTE2 of the light emitting element LE.

The first via layer VIA1 may include a plurality of connection holes CH1 and CH2. For example, the first via layer VIA1 may include a first connection hole CH1 overlapping the pixel electrode PXE and a second connection hole CH2 overlapping the common electrode CE. The first connection hole CH1 may expose the first reflective electrode SCT1 connected to the pixel electrode PXE, and the second connection hole CH2 may expose the second reflective electrode SCT2 connected to the common electrode CE. The first via layer VIA1 may be formed of an organic layer such as an acrylic resin, an epoxy resin, a phenolic resin, a polyamide resin, a polyimide resin, and/or the like.

The lower connection electrode BE2 is disposed on the upper surface of the first via layer VIA1 and contacts the second reflective electrode SCT2 through the second connection hole CH2. Further, the lower connection electrode BE2 is disposed on the second contact electrode CTE2 of the light emitting element LE. The lower connection electrode BE2 is in direct contact with the second contact electrode CTE2. Accordingly, the second contact electrode CTE2 of the light emitting element LE may be electrically connected to the common electrode CE through the lower connection electrode BE2 and the second reflective electrode SCT2.

The lower connection electrode BE2 does not overlap the first connection hole CH1 in the thickness direction (e.g., the third direction DR3). In a plan view, the area of the lower connection electrode BE2 is larger than the area of the light emitting element LE. The lower connection electrode BE2 may be formed to cover the light emitting element LE and may include an opening OA2 exposing the first contact electrode CTE1. The lower connection electrode BE2 is not electrically connected to the first contact electrode CTE1 through the protective layer INS of the light emitting element LE. Further, the lower connection electrode BE2 may be disposed on a portion of the side surface of the light emitting element LE but is disposed lower than the height of the light emitting element LE. Accordingly, the lower connection electrode BE2 is not directly connected to the upper connection electrode BE1. A second via layer VIA2 is disposed between the lower connection electrode BE2 and the upper connection electrode BE1.

The arrangement and width of the lower connection electrode BE2 will be described in detail with reference to FIGS. 9 and 10.

The upper connection electrode BE1 and the lower connection electrode BE2 may include a transparent conductive material (TCO) such as indium tin oxide (ITO) and/or indium zinc oxide (IZO) that is capable of transmitting light.

The second via layer VIA2 is disposed on the first via layer VIA1. The second via layer VIA2 may be disposed to completely cover the lower connection electrode BE2.

The second via layer VIA2 has a third connection hole CH3 in an area overlapping with the first connection hole CH1. Accordingly, the first connection hole CH1 and the third connection hole CH3 may be one connection hole connected to each other. Accordingly, the first reflective electrode SCT1 is exposed by the first connection hole CH1 and the third connection hole CH3.

The second via layer VIA2 may expose the first contact electrode CTE1 of the light emitting element LE. The second via layer VIA2 supports the upper connection electrode BE1 and flattens the step formed by the light emitting element LE. The second via layer VIA2 may be formed of the same material as the first via layer VIA1. The second via layer VIA2 may be formed of an organic layer such as an acrylic resin, an epoxy resin, a phenolic resin, a polyamide resin, a polyimide resin, and/or the like.

The upper connection electrode BE1 may be disposed on the upper surface of the second via layer VIA2 to cover the light emitting element LE. The upper connection electrode BE1 is disposed on the first contact electrode CTE1 of the light emitting element LE. The upper connection electrode BE1 is in contact with the first contact electrode CTE1 of the light emitting element LE. The upper connection electrode BE1 is in contact with the first reflective electrode SCT1 through the third connection hole CH3 and the first connection hole CH1.

The upper connection electrode BE1 may overlap the lower connection electrode BE2 in the thickness direction (e.g., the third direction DR3). In a plan view, the area of the upper connection electrode BE1 may be larger than the area of the light emitting element LE and may be larger than the area of the lower connection electrode BE2.

A wavelength control portion 200 may be disposed on the light emitting element layer EML. The wavelength control portion 200 may include a light blocking layer PW and a wavelength conversion layer QDL.

The light blocking layer PW may be disposed on the second via layer VIA2. The light blocking layer PW may overlap with the bank 190 in the third direction DR3 and may not overlap with the plurality of light emitting elements LE.

The light blocking layer PW may include a light blocking material to prevent light from the light emitting element LE of one sub-pixel from proceeding to the neighboring sub-pixel. For example, the light blocking layer PW may include an inorganic black pigment such as carbon black and/or an organic black pigment.

The light blocking layer PW may be formed as a single layer or multiple layers. When the light blocking layer PW is formed of multiple layers, it may include a first light blocking layer and/or a second light blocking layer that are sequentially stacked. The length in the first direction DR1 or the length in the second direction DR2 of the first light blocking layer may be greater than the length in the first direction DR1 or the length in the second direction DR2 of the second light blocking layer. In one or more embodiments, the first light blocking layer and second light blocking layer may be formed of an organic layer such as an acrylic resin, an epoxy resin, a phenolic resin, a polyamide resin, a polyimide resin, and/or the like.

The wavelength conversion layer QDL may convert or shift the peak wavelength of the incident light into light of a different specific peak wavelength. The wavelength conversion layer QDL may convert the blue third light emitted from the light emitting element LE into a red second light, a green first light, or transmit the blue third light as it is.

The wavelength conversion layer QDL may be disposed in the light emitting area partitioned by the light blocking layer PW and may be disposed to be spaced from each other.

The wavelength conversion layer QDL may include a first wavelength conversion pattern (or first light conversion layer) WCL1, a second wavelength conversion pattern (or second light conversion layer) WCL2, and a light transmission pattern (or light transmission layer) TPL.

The first light conversion layer WCL1, the second light conversion layer WCL2, and the light transmission layer TPL may be disposed in an area partitioned by the light blocking layer PW. For example, the first light conversion layer WCL1 may be disposed on the second via layer VIA2 in the first sub-pixel SPX1, and the second light conversion layer WCL2 may be disposed on the second via layer VIA2 in the second sub-pixel SPX2, and the light transmission layer TPL may be disposed on the second via layer VIA2 in the fourth subpixel SPX4.

The first light conversion layer WCL1 may convert a portion of the third light (e.g., light in the blue wavelength band) incident from the light emitting element LE into first light (e.g., light in the green wavelength band). The first light conversion layer WCL1 may include a first base resin BRS1, a first wavelength conversion particles WCP1, and scatterers SCP. The first base resin BRS1 may include a light-transmitting organic material. For example, the first base resin BRS1 may include an epoxy-based resin, an acrylic-based resin, a cardo-based resin, and/or an imide-based resin. The first wavelength conversion particle WCP1 may convert a portion of the third light (e.g., light in the blue wavelength band) incident from the light emitting element LE into first light (e.g., light in the green wavelength band). The first wavelength conversion particle WCP1 may be a quantum dot (QD), a quantum rod, a fluorescent material, and/or a phosphorescent material.

The second light conversion layer WCL2 may convert a portion of the third light (e.g., light in the blue wavelength band) incident from the light emitting element LE into second light (e.g., light in the red wavelength band). It may include a second base resin BRS2, a second wavelength conversion particle WCP2, and scatterers SCP. The second base resin BRS2 may include the light-transmitting organic material. For example, the second base resin BRS2 may include epoxy resin, acrylic resin, cardo resin, and/or imide resin. The second wavelength conversion particle WCP2 may convert a portion of the third light (e.g., light in the blue wavelength band) incident from the light emitting element LE into second light (e.g., light in the red wavelength band). The second wavelength conversion particle WCP2 may be a quantum dot (QD), a quantum rod, a fluorescent material, and/or a phosphorescent material.

The light transmission layer TPL may include the light-transmitting organic material. For example, the light transmission layer TPL may include a third base resin BRS3 and scatterers SCP. For example, the light transmission layer TPL may include epoxy resin, acrylic resin, cardo resin, and/or imide resin.

The reflective layer RFL may be disposed between the light blocking layer PW and the first light conversion layer WCL1, between the light blocking layer PW and the second light conversion layer WCL2, and between the light blocking layer PW and the light transmission layer TPL. The reflective layer RFL may be disposed on the side of the light blocking layer PW. The reflective layer RFL serves to reflect light from the first light conversion layer WCL1, the second light conversion layer WCL2, and the light transmission layer TPL in the lateral direction.

The reflective layer RFL may include a highly reflective metal material such as aluminum (Al). The thickness of the reflective layer RFL may be approximately 0.1 μm.

Alternatively, the reflective layer RFL may include M (where M is an integer greater than or equal to 2) pairs of first and second layers having different refractive indices to act as Distributed Bragg Reflectors (DBR). In this case, M first layers and M second layers may be arranged alternately. The first layer and the second layer may be formed of an inorganic film, for example, a silicon nitride layer, a silicon oxynitride layer, a silicon oxide layer, a titanium oxide layer, and/or an aluminium oxide layer.

The capping layer CAP may be disposed on the light blocking layer PW, the first light conversion layer WCL1, the second light conversion layer WCL2, and the light transmission layer TPL. The capping layer CAP may be formed of an inorganic film, for example, a silicon nitride layer, a silicon oxynitride layer, a silicon oxide layer, a titanium oxide layer, and/or an aluminum oxide layer. The first light conversion layer WCL1, the second light conversion layer WCL2, and the light transmission layer TPL may be sealed by the capping layer CAP.

The color filter layer CFL may be disposed on the wavelength control portion 200. The color filter layer CFL may include a first overcoat layer OC1, a first color filter CF1, a second color filter CF2, a third color filter CF3, and a second overcoat layer OC2.

The first overcoat layer OC1 may be disposed on the wavelength control portion 200. The first overcoat layer OC1 may be directly disposed on the capping layer CAP of the wavelength control portion 200. The first overcoat layer OC1 may be disposed entirely over the display area and may have a flat surface. The first overcoat layer OC1 may flatten the step formed by the lower wavelength control portion 200 to facilitate the formation of the color filter layer CFL.

The first overcoat layer OC1 may include a light-transmitting organic material. For example, the first overcoat layer OC1 may include epoxy resin, acrylic resin, cardo resin, and/or imide resin.

The first color filter CF1, the second color filter CF2, and the third color filter CF3 may be disposed on the first overcoat layer OC1.

The first color filter CF1 disposed in the first sub-pixel SPX1 may transmit first light (e.g., light in the green wavelength band) and absorb or block third light (e.g., light in the blue wavelength band). Therefore, the first color filter CF1 may transmit the first light (e.g., light in the green wavelength band) converted by the first light conversion layer WCL1 from among the third light (e.g., light in the blue wavelength band) emitted by the light emitting element LE and absorb or block the third light (e.g., light in the blue wavelength band) not converted by the first light conversion layer WCL1. Accordingly, the first sub-pixel SPX1 may emit first light (e.g., light in the green wavelength band).

The second color filter CF2 disposed in the second sub-pixel SPX2 may transmit second light (e.g., light in the red wavelength band) and absorb or block third light (e.g., light in the blue wavelength band). Therefore, the second color filter CF2 may transmit the second light (e.g., light in the red wavelength band) converted by the second light conversion layer WCL2 from among the third light (e.g., light in the blue wavelength band) emitted by the light emitting element LE and absorb or block the third light (e.g., light in the blue wavelength band) not converted by the second light conversion layer WCL2. Accordingly, the second sub-pixel SPX2 may emit the second light (e.g., light in a red wavelength band).

The third color filter CF3 disposed in the fourth sub-pixel SPX4 may transmit third light (e.g., light in the blue wavelength band). Therefore, the third color filter CF3 may transmit the third light (e.g., light in the blue wavelength band) emitted from the light emitting element LE through the light transmission layer TPL. Accordingly, the fourth sub-pixel SPX4 may emit the third light (e.g., light in the blue wavelength band).

The area where the first color filter CF1, second color filter CF2, and third color filter CF3 overlap may serve as a light blocking area. The area where the first color filter CF1, second color filter CF2, and third color filter CF3 overlap may overlap with the bank 190 and the light blocking layer PW.

The second overcoat layer OC2 may be disposed on the plurality of color filters CF1, CF2, and CF3. The second overcoat layer OC2 may be directly disposed on the color filters CF1, CF2, and CF3 of the color filter layer CFL. The second overcoat layer OC2 may be disposed entirely in the display area DA and may have a flat surface. The second overcoat layer OC2 may flatten the step formed by the color filters CF1, CF2, and CF3. The second overcoat layer OC2 may include a light-transmitting organic material and may be substantially the same as or similar to the first overcoat layer OC1 described above.

Figure 9:
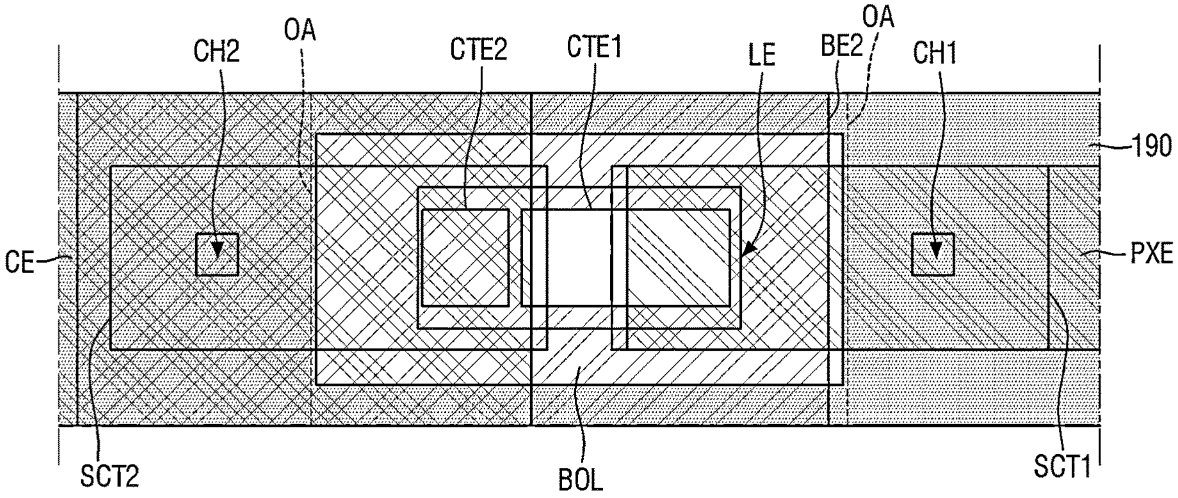
FIG. 9 is a plan view to illustrate an arrangement of the light emitting element and a lower connection electrode.

FIG. 9 is a plan view to illustrate an arrangement of the light emitting element and a lower connection electrode. FIG. 10 is a plan view to illustrate the arrangement of a misaligned light emitting element and a lower connection electrode.

Figure 10:
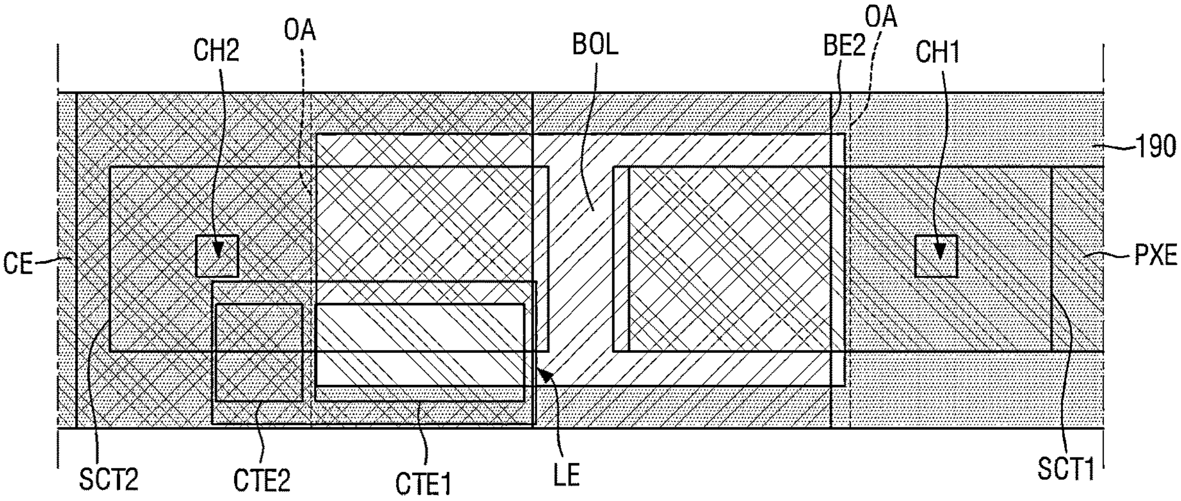
FIG. 10 is a plan view to illustrate the arrangement of a misaligned light emitting element and a lower connection electrode.

Referring to FIGS. 9 and 10, the lower connection electrode BE2 overlaps the second connection hole CH2 and the second contact electrode CTE2 in the thickness direction (e.g., the third direction DR3) and may be around (e.g., may surround) the light emitting element LE. The lower connection electrode BE2 may partially overlap the bank 190. Further, because the lower connection electrode BE2 is disposed wider than the light emitting element LE, the lower connection electrode BE2 may connect the second contact electrode CTE2 and the common electrode CE even when the light emitting element LE is misaligned and moves out of the opening OA as shown in FIG. 10. For example, even if the light emitting element LE and the second connection hole CH2 are not arranged in a straight line, the lower connection electrode BE2 may connect the second contact electrode CTE2 and the common electrode CE.

Figure 11:
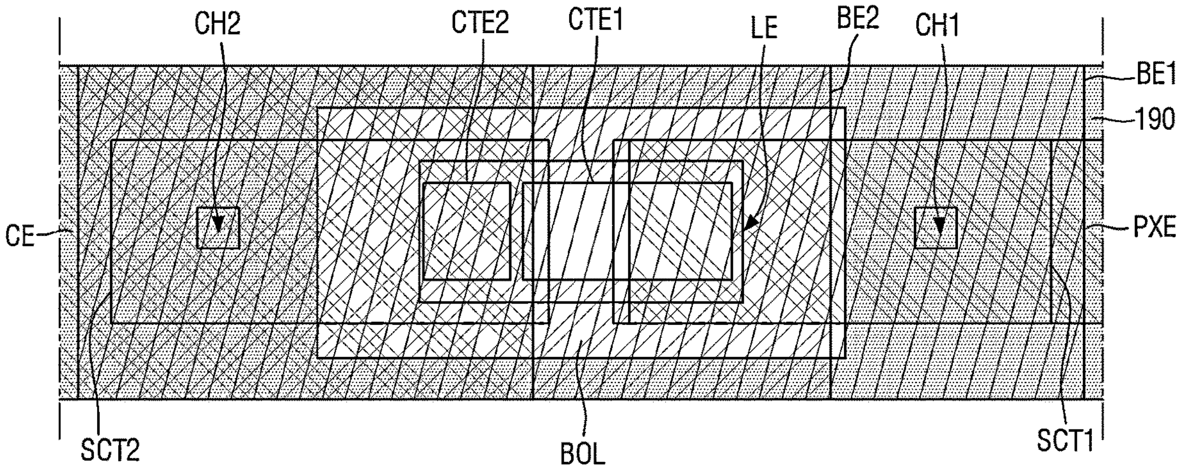
FIG. 11 is a plan view to illustrate an arrangement of the light emitting element and an upper connection electrode.
Figure 12:
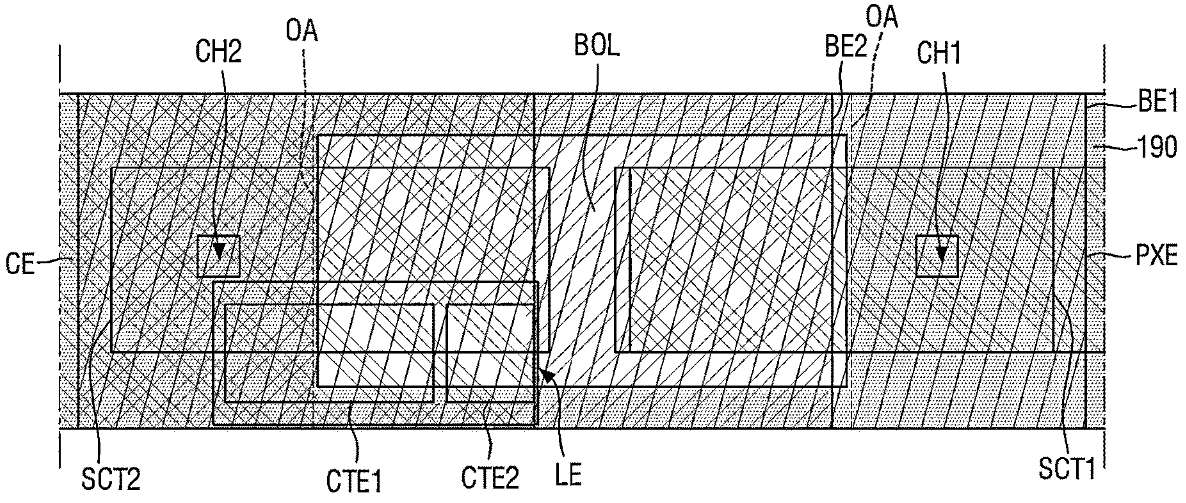
FIG. 12 is a plan view to illustrate an arrangement of the misaligned light emitting element and an upper connection electrode.

FIG. 11 is a plan view to illustrate an arrangement of the light emitting element and an upper connection electrode. FIG. 12 is a plan view to illustrate an arrangement of the misaligned light emitting element and an upper connection electrode.

Referring to FIGS. 11 and 12, the upper connection electrode BE1 may overlap the first connection hole CH1, the second connection hole CH2, the third connection hole CH3, the first contact electrode CTE1, and the second contact electrode CTE2 in the thickness direction (e.g., the third direction DR3) and may cover the light emitting element LE. The upper connection electrode BE1 may partially overlap the bank 190.

In a plan view, the area of the upper connection electrode BE1 may be larger than the area of the light emitting element LE, may be larger than the area of the opening OA, and may be larger than the area of the lower connection electrode BE2.

Because the upper connection electrode BE1 is disposed wider than the light emitting element LE, the upper connection electrode BE1 may connect the first contact electrode CTE1 and the pixel electrode PXE even when the light emitting element LE is misaligned and moves out of the opening OA as shown in FIG. 12. For example, even if the light emitting element LE and the third connection hole CH3 and the first connection hole CH1 are not arranged in a straight line, the upper connection electrode BE1 may connect the first contact electrode CTE1 and the pixel electrode PXE.

Figure 13:
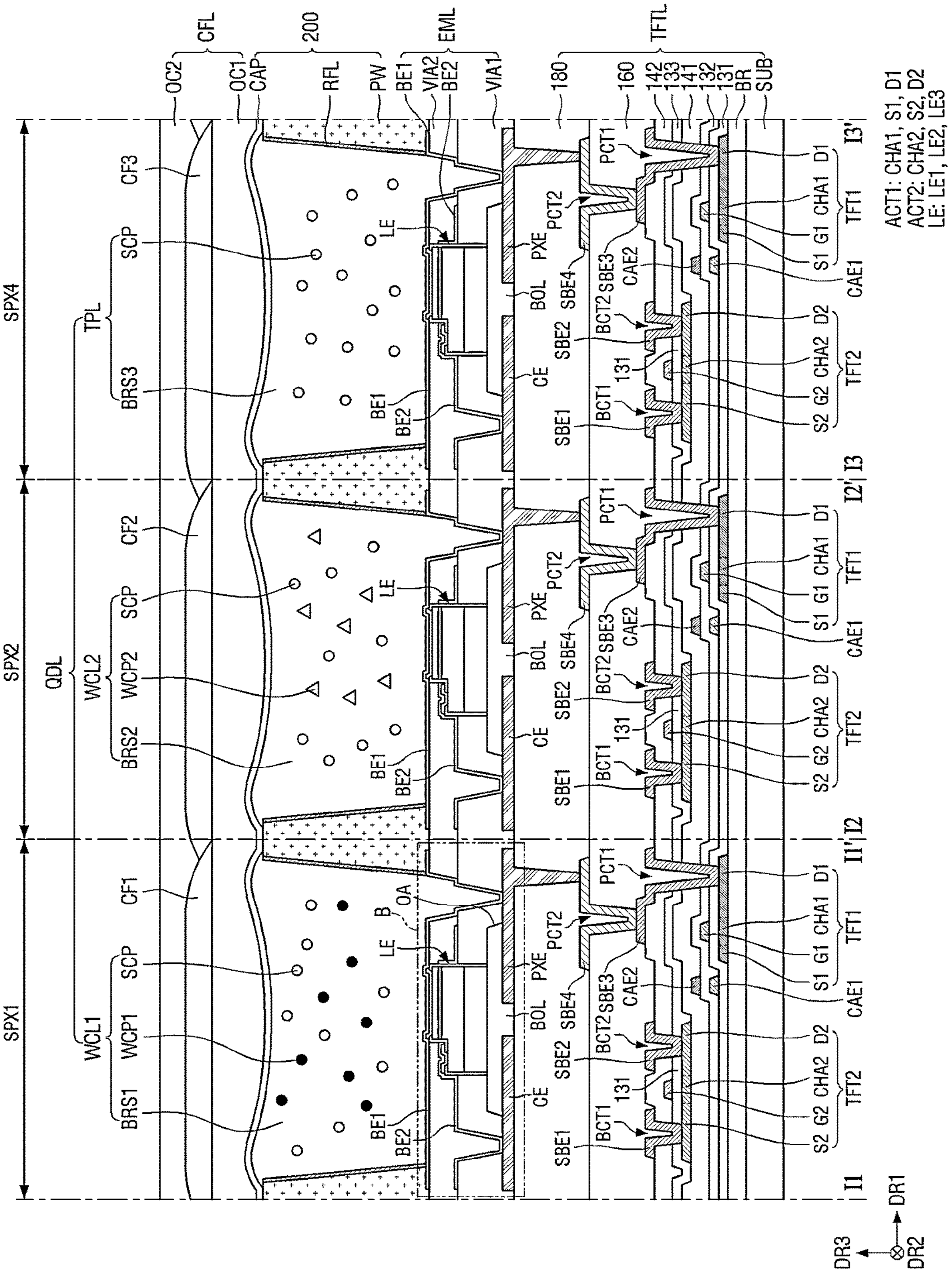
FIG. 13 is a cross-sectional view illustrating one example of a cross-section of a display panel corresponding to the lines I1-I1', I2-I2', and I3-I3' of FIG. 6, according to one or more embodiments.
Figure 14:
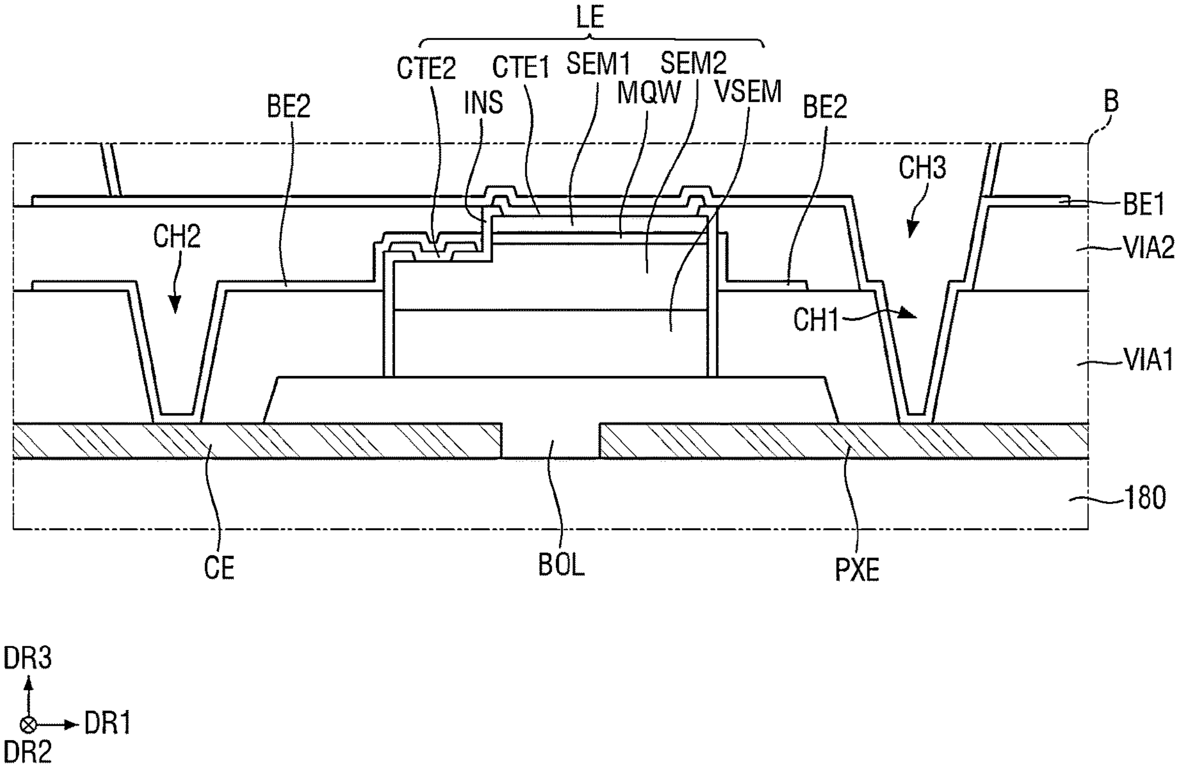
FIG. 14 is a cross-sectional view illustrating one example of a region B of FIG. 13 in detail.

FIG. 13 is a cross-sectional view illustrating one example of a cross-section of a display panel corresponding to the lines I1-I1', I2-I2', and I3-I3' of FIG. 6, according to one or more embodiments. FIG. 14 is a cross-sectional view illustrating one example of a region B of FIG. 13 in detail.

Referring to FIGS. 13 and 14, it differs from the embodiment of FIG. 8 in that the bank (190 of FIG. 8) and the reflective electrode (SCT1 and SCT2 of FIG. 8) are not arranged, and the pixel electrode PXE and the common electrode CE are directly exposed through the first connection hole CH1, the second connection hole CH2, and the third connection hole CH3. Hereinafter, descriptions overlapping with the above-described embodiment will be omitted and differences will be described.

As shown in FIG. 13, a light emitting element layer EML may be disposed on the second organic layer 180. The light emitting element layer EML further includes pixel electrodes PXE, light emitting elements LE, a common electrode CE, an organic pattern layer BOL, an upper connection electrode BE1, and a lower connection electrode BE2.

The pixel electrode PXE and the common electrode CE may be disposed on the second organic layer 180.

The organic pattern layer BOL may be disposed between the pixel electrode PXE and the common electrode CE. The organic pattern layer BOL may cover the edges of the pixel electrode PXE and the common electrode CE. The organic pattern layer BOL may overlap at least a portion of the pixel electrode PXE and the common electrode CE.

The organic pattern layer BOL may be in contact with the bottom surface of the light emitting element LE. Further, the organic pattern layer BOL may be in contact with at least a portion of each side of the light emitting element LE.

The light emitting element LE may be disposed on the organic pattern layer BOL. The first contact electrode CTE1 and the second contact electrode CTE2 both protrude from the top surface of the light emitting element LE and a lateral type micro LED in which current flows in the lateral direction is shown in the drawings.

The first via layer VIA1 is disposed at a first height h1 (e.g., see FIG. 8) to support the lower connection electrode BE2 and to flatten the step formed by the light emitting element LE.

The first via layer VIA1 may include a plurality of connection holes CH1 and CH2. For example, the first via layer VIA1 may include a first connection hole CH1 overlapping the pixel electrode PXE and a second connection hole CH2 overlapping the common electrode CE. The first connection hole CH1 exposes the pixel electrode PXE, and the second connection hole CH2 exposes the common electrode CE.

The first via layer VIA1 may be formed of an organic layer such as an acrylic resin, an epoxy resin, a phenolic resin, a polyamide resin, a polyimide resin, and/or the like.

The lower connection electrode BE2 serves to connect the common electrode CE and the second contact electrode CTE2 of the light emitting element LE. The lower connection electrode BE2 is disposed on the top surface of the first via layer VIA1 and contacts the common electrode CE through the second connection hole CH2. Further, the lower connection electrode BE2 is disposed on the second contact electrode CTE2 of the light emitting element LE. The lower connection electrode BE2 is in direct contact with the second contact electrode CTE2. Accordingly, the second contact electrode CTE2 of the light emitting element LE may be electrically connected to the common electrode CE through the lower connection electrode BE2.

The lower connection electrode BE2 does not overlap the first connection hole CH1 in the thickness direction (e.g., the third direction DR3). In a plan view, the area of the lower connection electrode BE2 is larger than the area of the light emitting element LE.

The second via layer VIA2 is disposed on the first via layer VIA1. The second via layer VIA2 may be disposed to completely cover the lower connection electrode BE2.

The second via layer VIA2 has a third connection hole CH3 in an area overlapping with the first connection hole CH1. Accordingly, the first connection hole CH1 and the third connection hole CH3 may be single connection hole connected to each other. Accordingly, the pixel electrode PXE is exposed by the first connection hole CH1 and the third connection hole CH3.

The upper connection electrode BE1 serves to connect the pixel electrode PXE and the first contact electrode CTE1 of the light emitting element LE.

It may overlap the lower connection electrode BE2 in the thickness direction (e.g., the third direction DR3). In a plan view, the area of the upper connection electrode BE1 may be larger than the area of the light emitting element LE and may be larger than the area of the lower connection electrode BE2.

FIGS. 15-28 are diagrams for illustrating a method of manufacturing a display device according to one or more embodiments.

FIGS. 16-28 are cross-sectional views of the structure of each layer of the display device in the order of formation, respectively. When necessary, a plan view showing the structure of the layers of the display device in the order of formation is also shown. FIGS. 16-28 mainly show the manufacturing process of the light emitting element layer EML, and each may broadly correspond to the cross-sectional view of FIG. 8. In addition, the following will focus on the first sub-pixel SPX1 of the display device.

Figure 15:
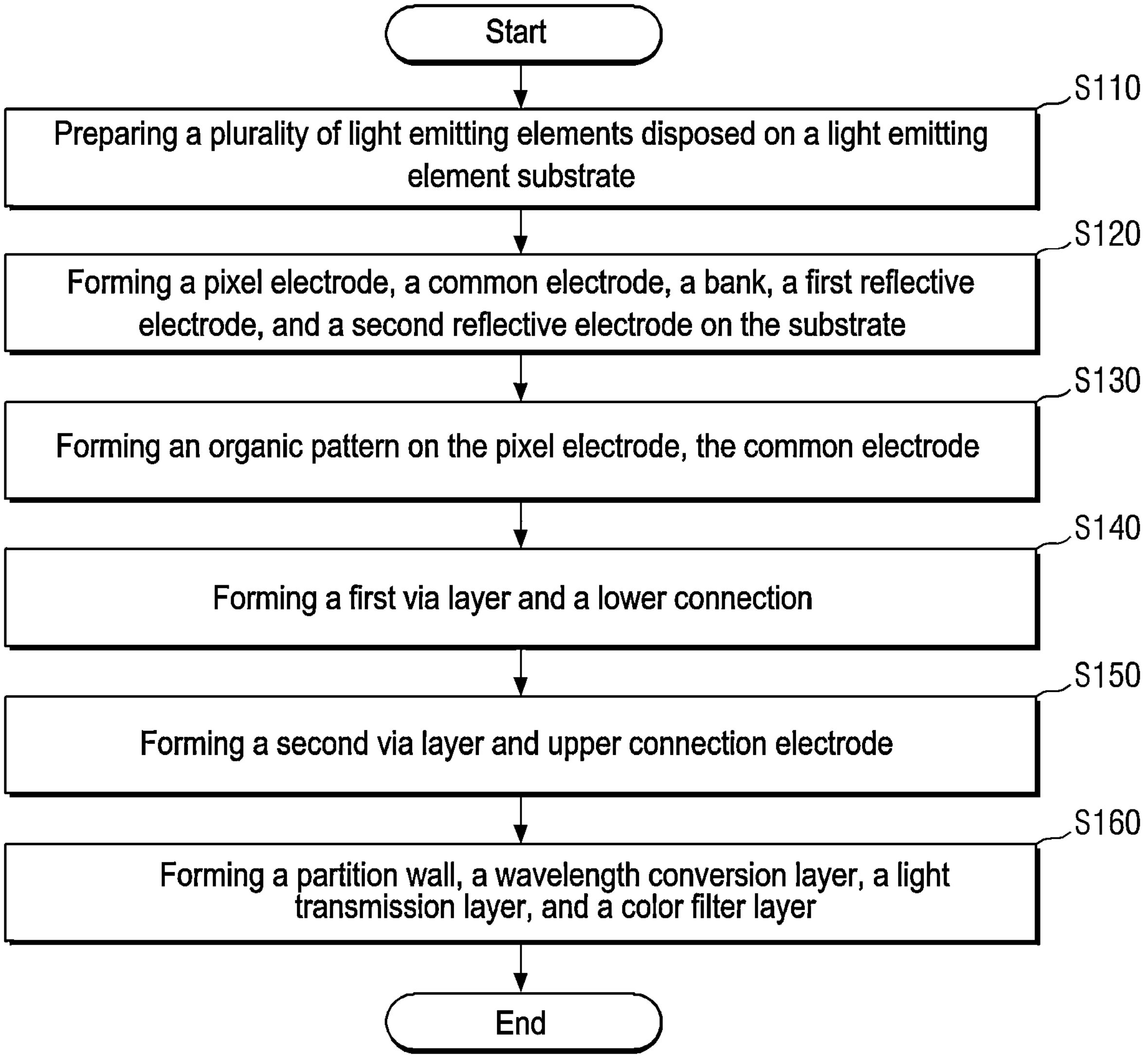
FIGS. 15-28 are diagrams for illustrating a method of manufacturing a display device according to one or more embodiments.
Figure 16:
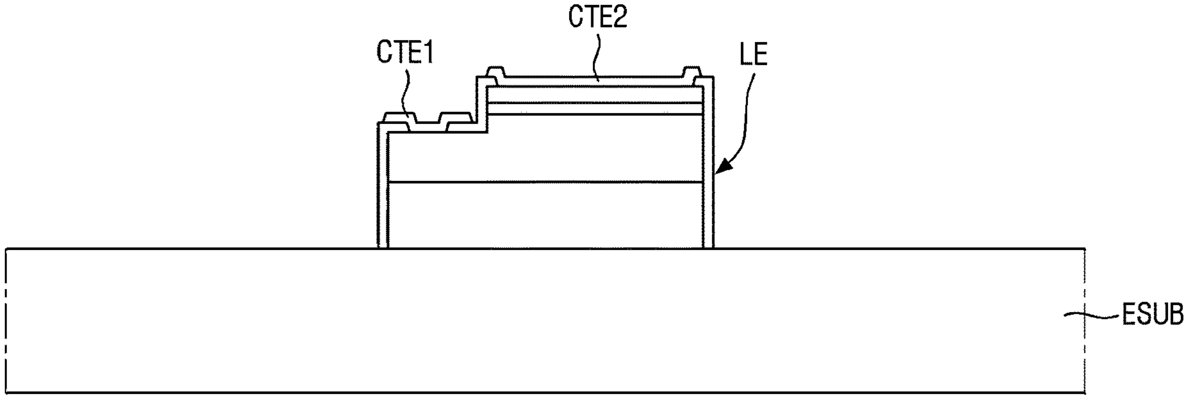

First, as shown in FIG. 16, a plurality of light emitting elements LE disposed on a light emitting element substrate ESUB are prepared (S110 in FIG. 15).

The light emitting element LE is disposed on the light emitting element substrate ESUB. The light emitting element substrate ESUB may include a material that allows light to be transmitted. The light emitting element substrate ESUB may include a support layer and an adhesive layer. For example, the support layer may include transparent polymers such as polyimide, polyester, polyacrylic, polyepoxy, polyethylene, polystyrene, polyethylene terephthalate, and/or the like. The adhesive layer may include an adhesive material for bonding the plurality of light emitting elements LE. For example, the adhesive material may include urethane acrylate, epoxy acrylate, polyester acrylate, and/or the like.

The light emitting element LE may be fixed by being adhered to an adhesive layer of the light emitting element substrate ESUB.

Figure 17:
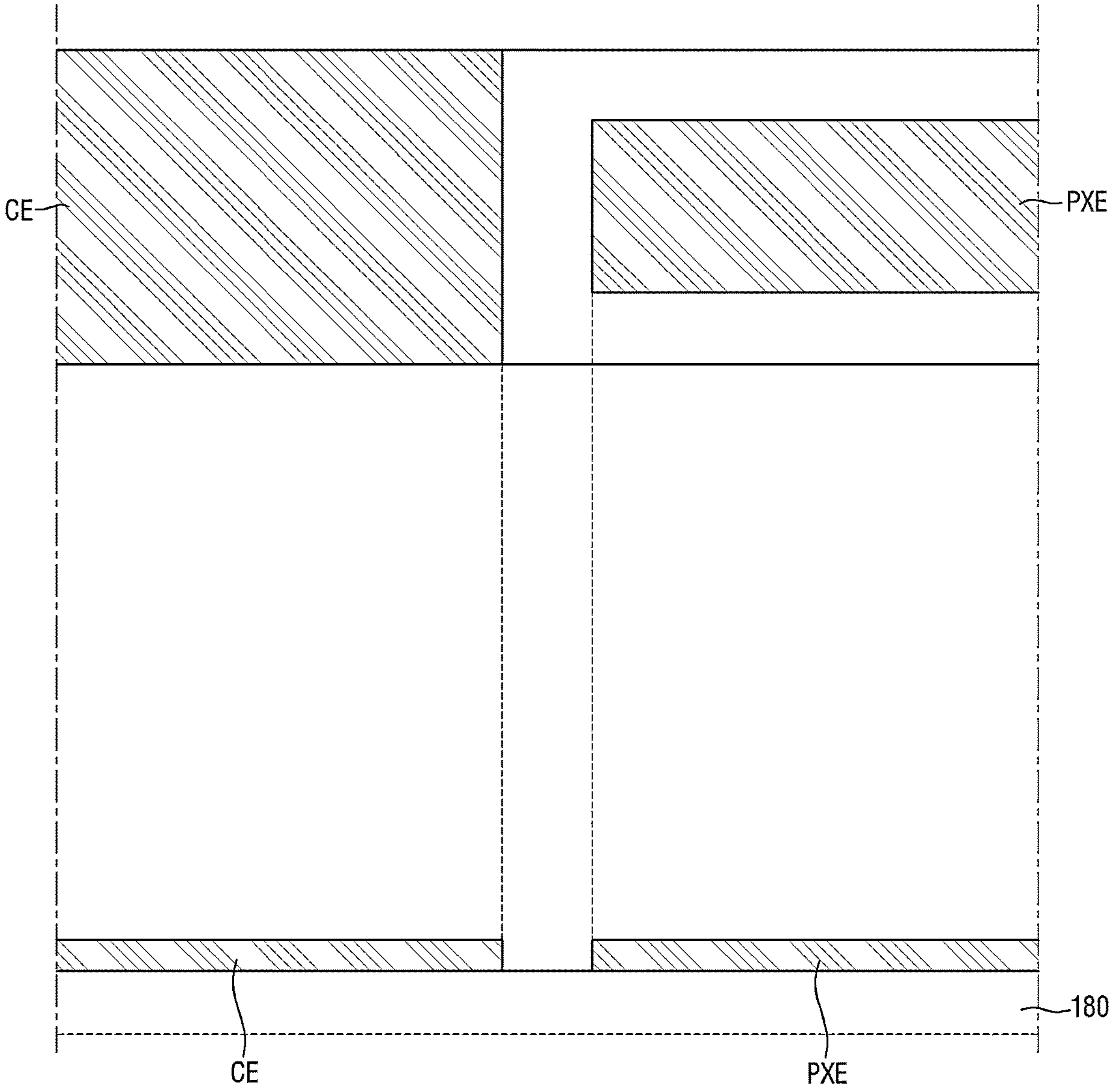
Figure 18:
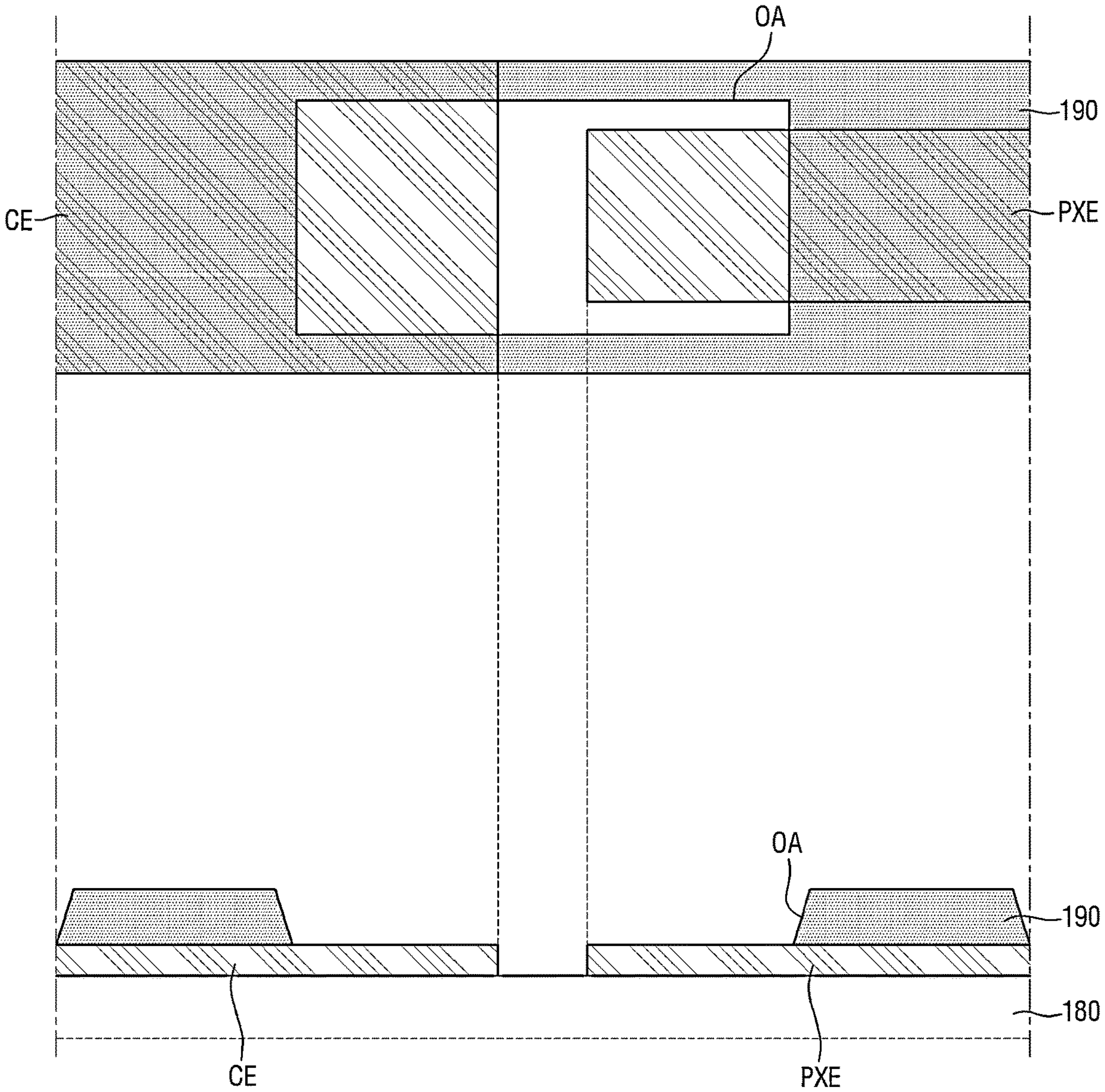
Figure 19:
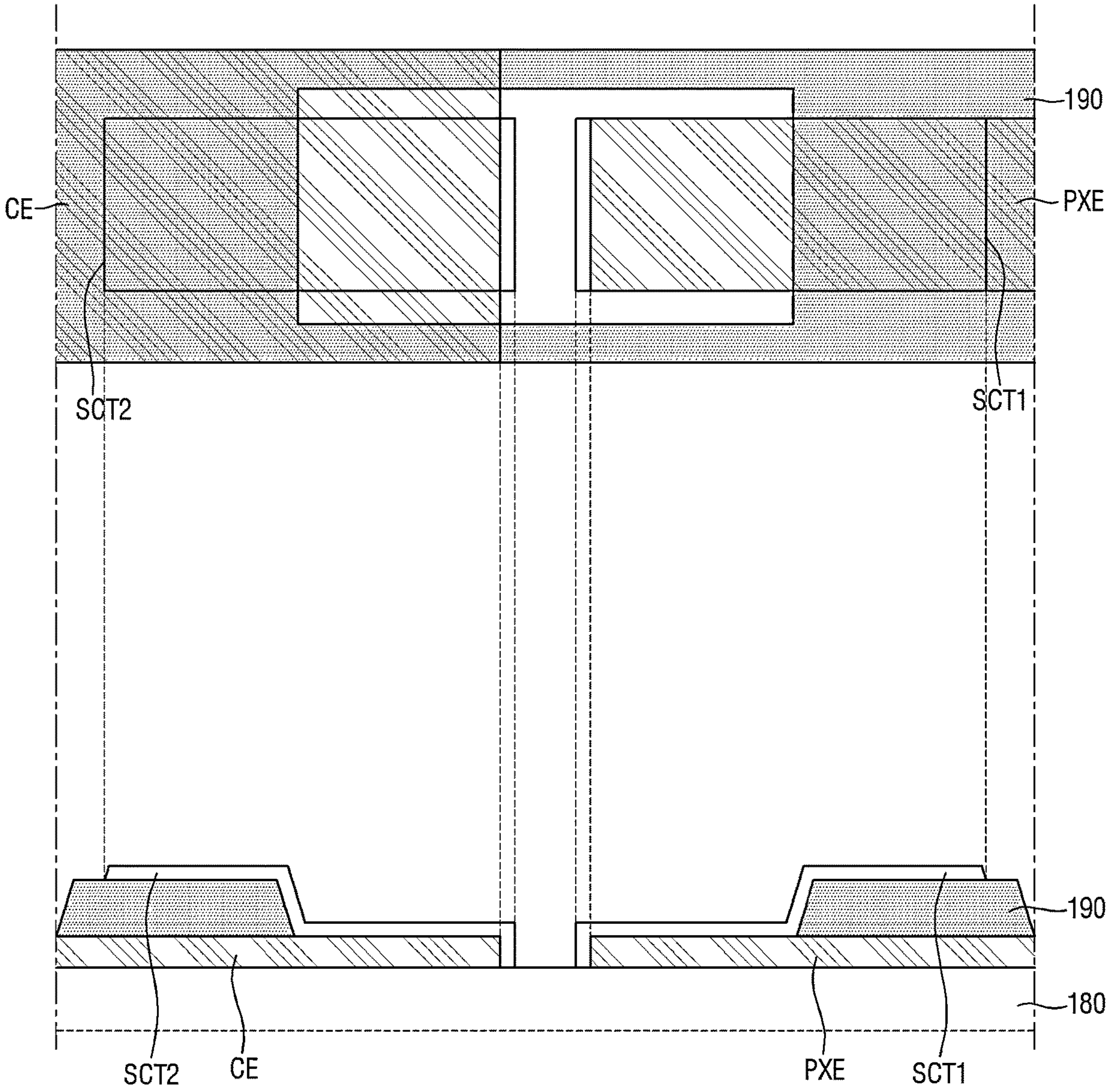

Second, with reference to FIGS. 17-19, pixel electrodes PXE, a common electrode CE, a bank 190, a first reflective electrode SCT1, and second reflective electrode SCT2 are formed on a substrate SUB including a thin film transistor layer (TFTL of FIG. 7) using a mask (S120 of FIG. 15).

First, referring to FIG. 17, pixel electrodes PXE and common electrodes CE are formed on the second organic layer 180 using a photolithography process. Each of the pixel electrodes PXE may be disposed on a corresponding connection hole.

Next, referring to FIG. 18, an organic material is entirely applied on the second organic layer 180 to cover the pixel electrodes PXE and the common electrode CE to form the bank 190, and then an opening OA is formed using a mask. At least a portion of the pixel electrodes PXE and the common electrode CE may be exposed through the opening OA. The bank 190 may be formed to cover the edges of each of the pixel electrodes PXE and the common electrode CE.

Next, referring to FIG. 19, a first reflective electrode SCT1 is disposed on the pixel electrode PXE and the bank 190, and a second reflective electrode SCT2 is disposed on the common electrode CE and the bank 190.

After forming the reflective electrode layer that covers the bank 190, the pixel electrode PXE, and the common electrode CE, the first reflective electrode SCT1 and the second reflective electrode SCT2 are formed using a mask.

Figure 20:
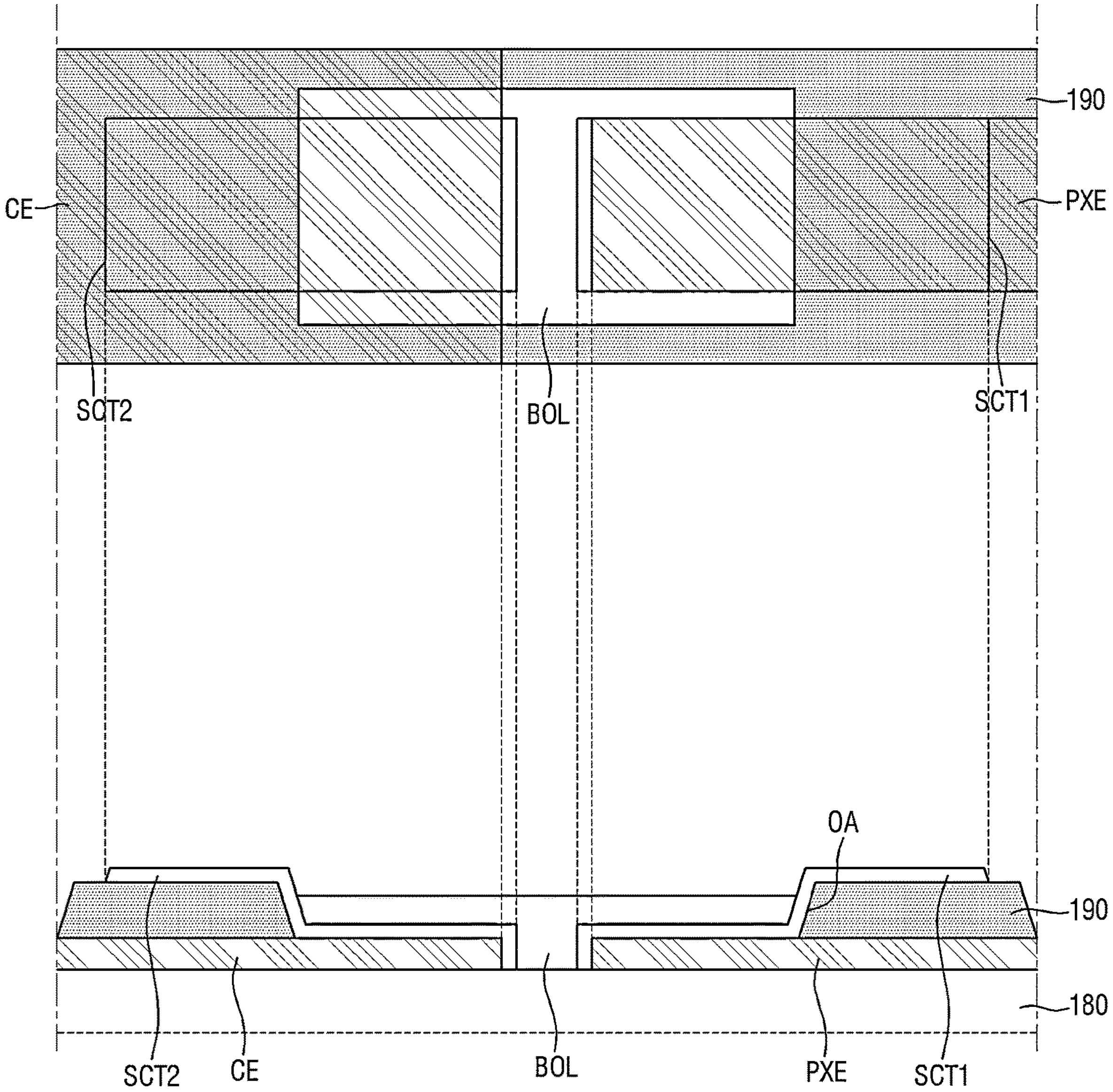
Figure 21:
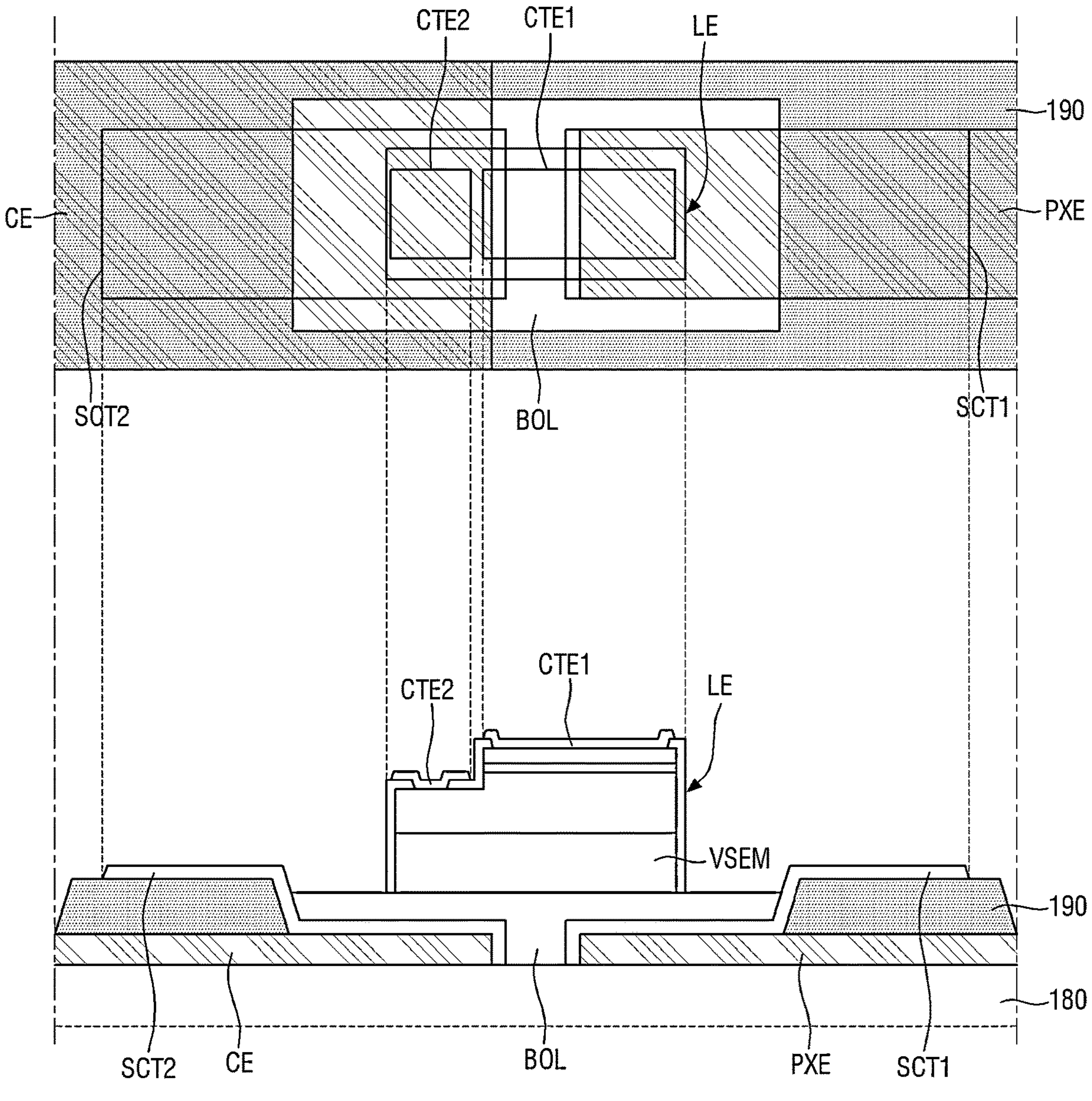

Third, referring to FIGS. 20 and 21, an organic pattern layer BOL is formed on the pixel electrodes PXE and the common electrode CE in the opening OA, and the light emitting element LE is fixed to the organic pattern layer BOL (S130 in FIG. 15).

The organic pattern layer BOL may be a temporary adhesive layer, or a temporary fixation layer that serves to temporarily fix or adhere the plurality of light emitting elements LE in the process of transferring the plurality of light emitting elements LE to the display panel. The thickness of the organic pattern layer BOL may be less than the height of the opening OA or the thickness of the bank 190.

The organic pattern layer BOL may be a photosensitive organic layer such as photoresist. Alternatively, the organic pattern layer BOL may be formed from an acrylic resin, an epoxy resin, a phenolic resin, a polyamide resin, a polyimide resin, and/or the like.

Next, the light emitting element LE of the light emitting element substrate ESUB is transferred onto the organic pattern layer BOL. For example, the light emitting element LE of the light emitting element substrate ESUB may be picked up and transferred to the organic pattern layer BOL using a stamp. At this time, the stamp may include an adhesive layer that is higher than the adhesive layer of the light emitting element substrate ESUB, so that the light emitting elements LE may be detached from the light emitting element substrate ESUB. Each of the plurality of light emitting elements LE that are detached from the light emitting element substrate ESUB and transferred to the stamp may be temporarily fixed by being embedded in the organic pattern layer BOL.

At this time, a portion of each of the plurality of light emitting elements LE may be temporarily fixed by being embedded in the organic pattern layer BOL. For example, the undoped semiconductor layer USEM of each of the plurality of light emitting elements LE may be embedded in the organic pattern layer BOL and fixed.

If the organic pattern layer BOL is a photosensitive organic layer such as a photoresist, the organic pattern layer BOL may be soft baked at a first temperature, and then at least a portion of each of the plurality of light emitting elements LE may be inserted into the organic pattern layer BOL. Then, the organic pattern layer BOL may be completely cured at a second temperature higher than the first temperature. The first temperature may be approximately 100 degrees, and the second temperature may be approximately 230 degrees, but the present disclosure is not limited thereto. In the process of curing the organic pattern layer BOL at the first temperature, the organic pattern layer BOL is fluid because the first temperature is low enough to fully cure the organic pattern layer BOL, which allows the organic pattern layer BOL to spread throughout the opening OA. Furthermore, the process of fully curing the organic pattern layer BOL at the second temperature may be performed for approximately 30 minutes.

Then, by applying heat to the adhesive layer of the stamp to reduce the adhesion of the adhesive layer, the stamp may be separated from the plurality of light emitting elements LE.

Fourth, referring to FIGS. 22-25, a first via layer VIA1 having a first connection hole CH1 and a second connection hole CH2 is formed, and a lower connection electrode BE2 is formed on the first via layer VIA1 (S140 in FIG. 15).

Figure 22:
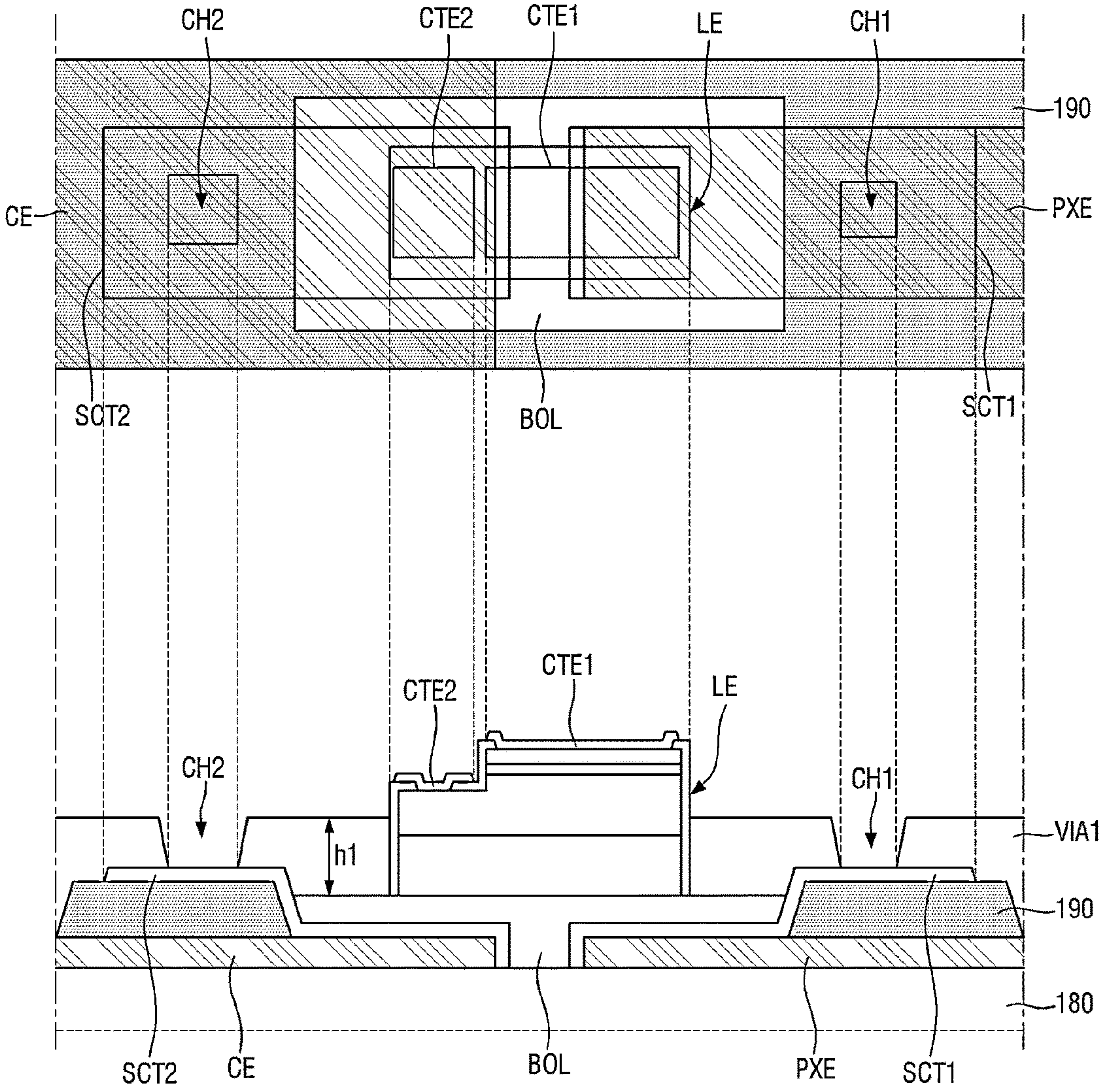

First, referring to FIG. 22, an organic material is first applied to a first height h1, and then a first connection hole CH1 and a second connection hole CH2 are formed using a mask. The first via layer VIA1 is formed lower than the second contact electrode CTE2 so that the second contact electrode CTE2 and the first contact electrode CTE1 of the light emitting element LE protrude onto the first via layer VIA1.

Figure 23:
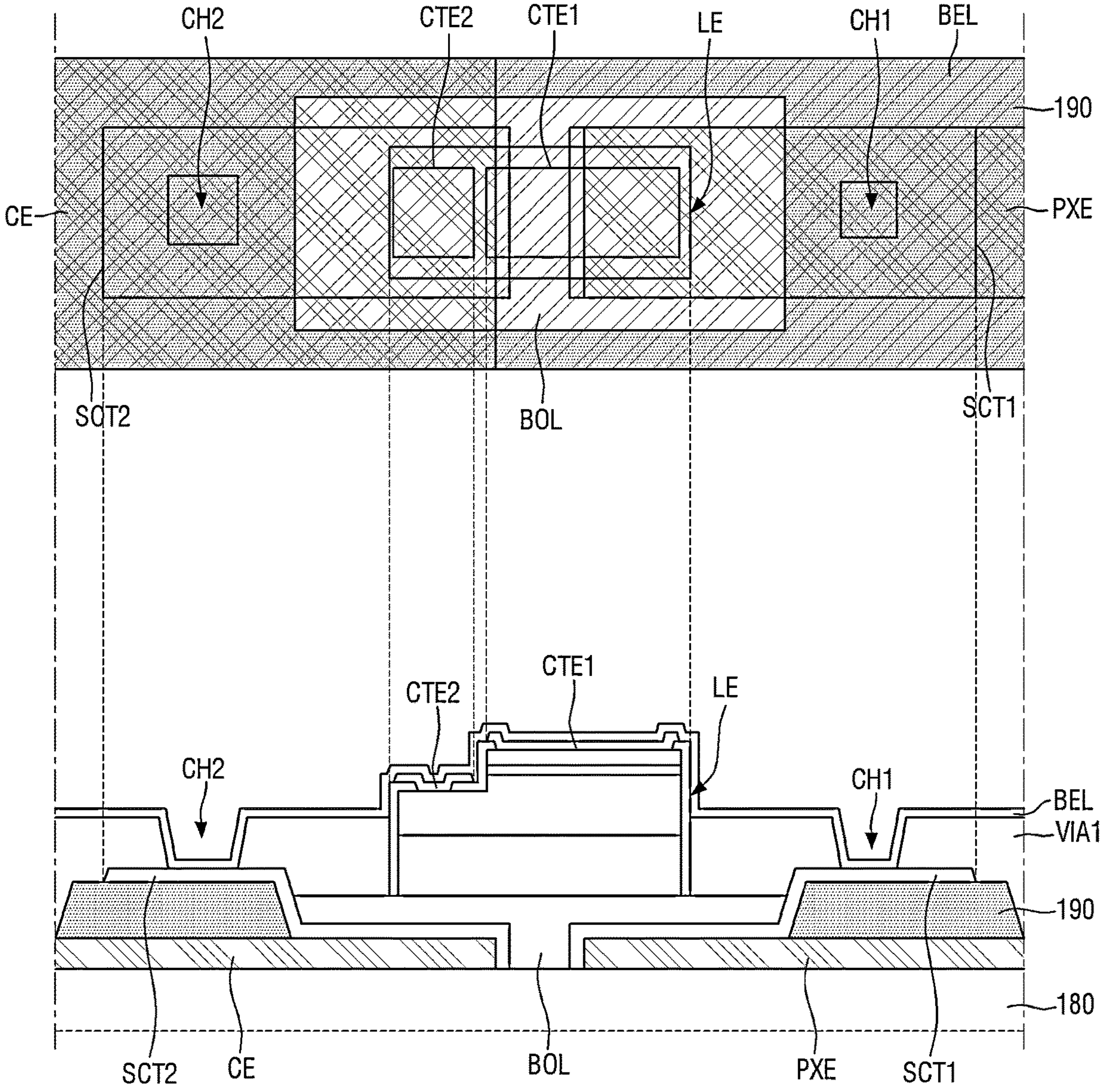
Figure 24:
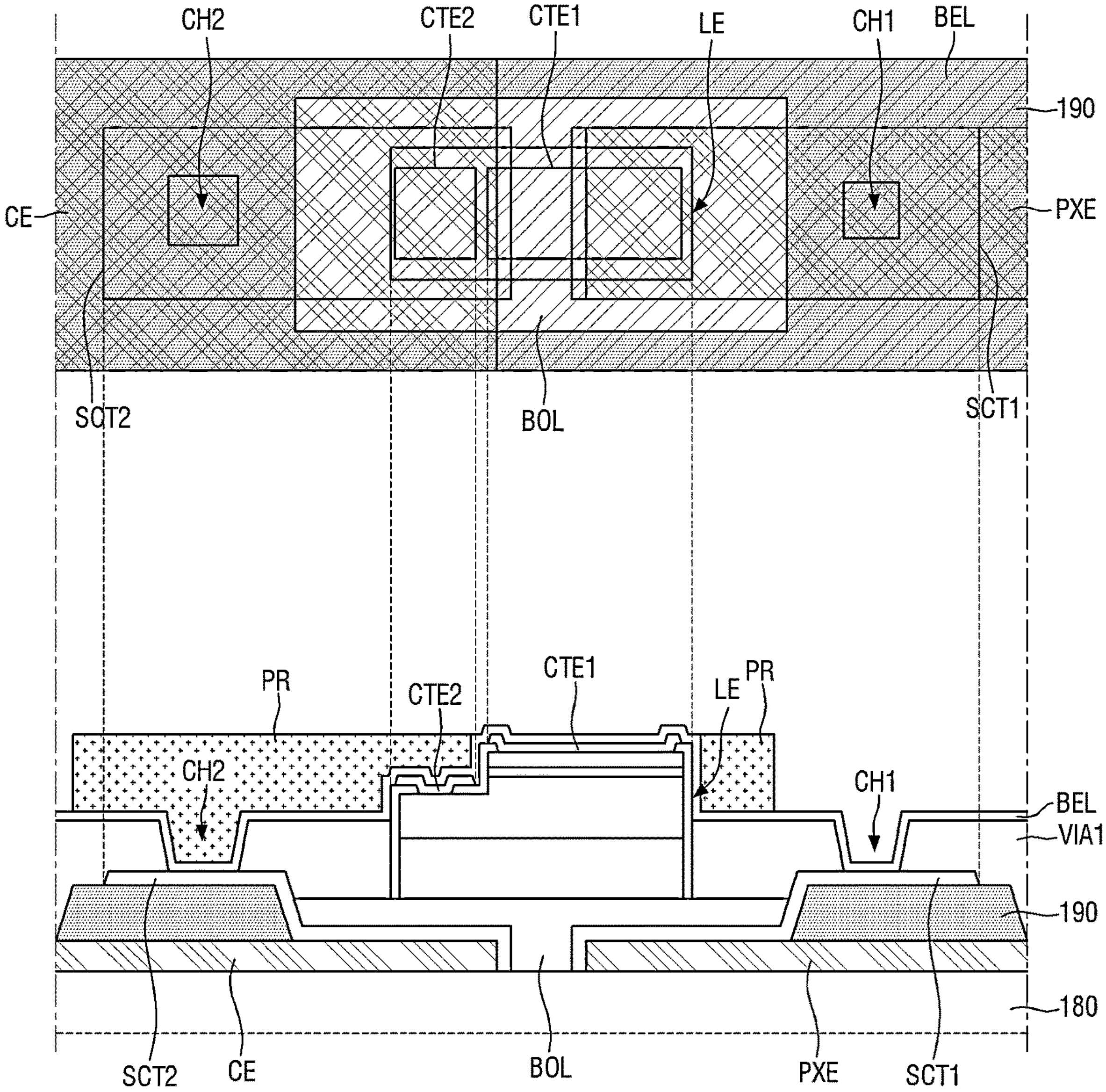
Figure 25:
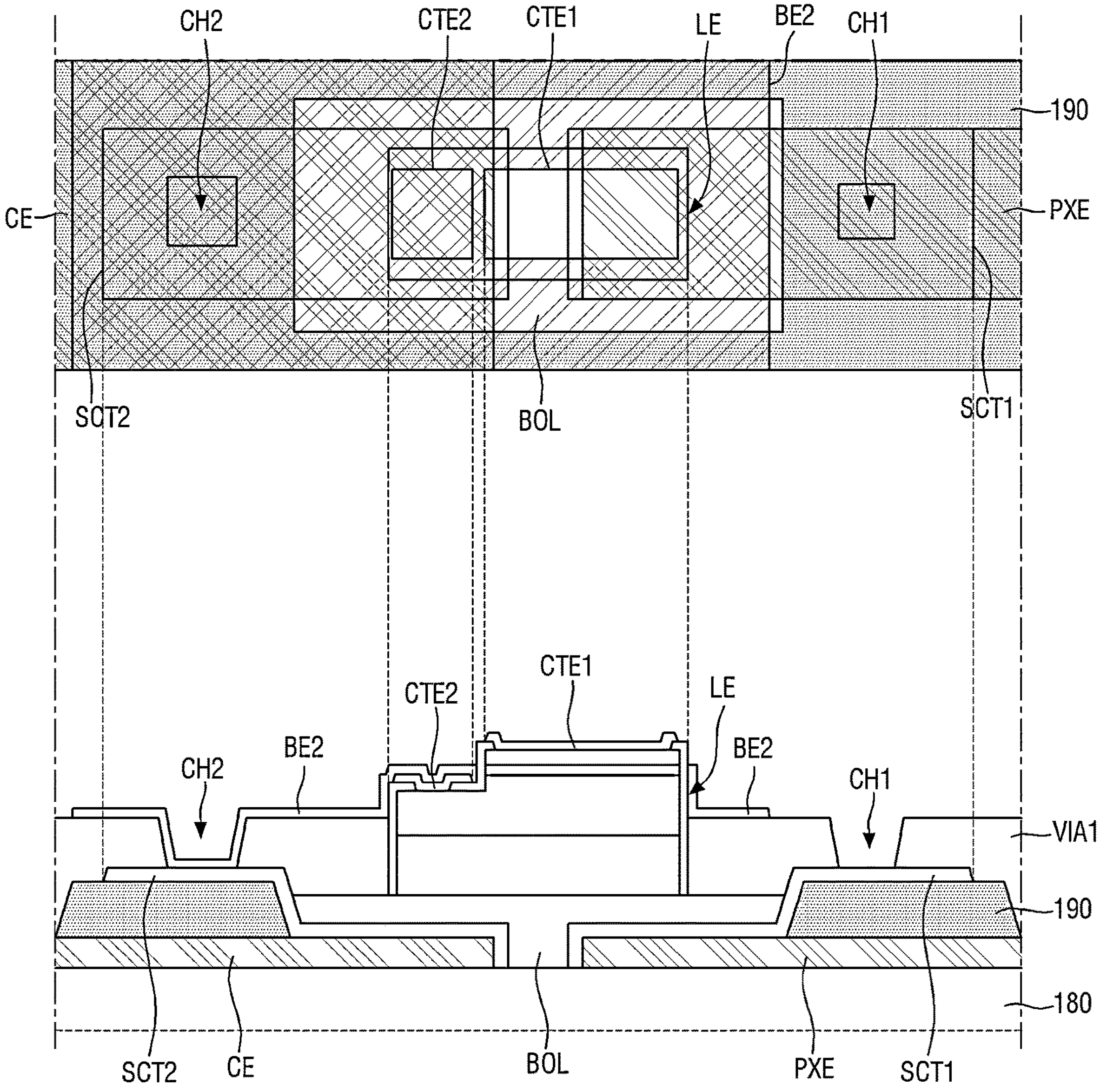

Next, referring to FIG. 23, a connection electrode layer BEL is formed to cover the first via layer VIA1 and the light emitting element LE. Next, referring to FIG. 24, is applied to the remaining area except for the area around the first contact electrode CTE1 and the first connection hole CH1. Next, referring to FIG. 25, the lower connection electrode BE2 is formed by removing the connection electrode layer BEL in the area where the photoresist PR is not applied.

Figure 26:
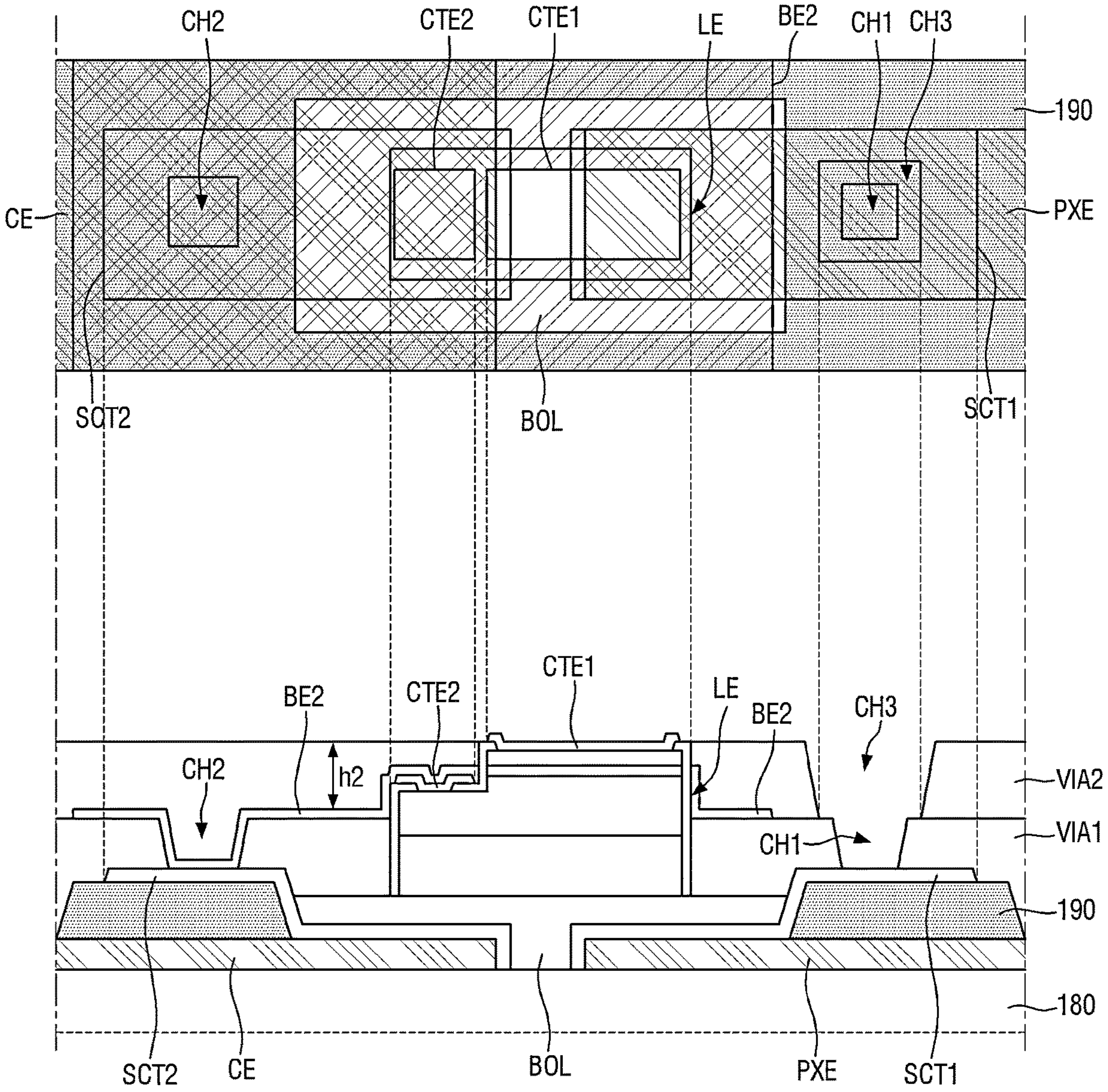
Figure 27:
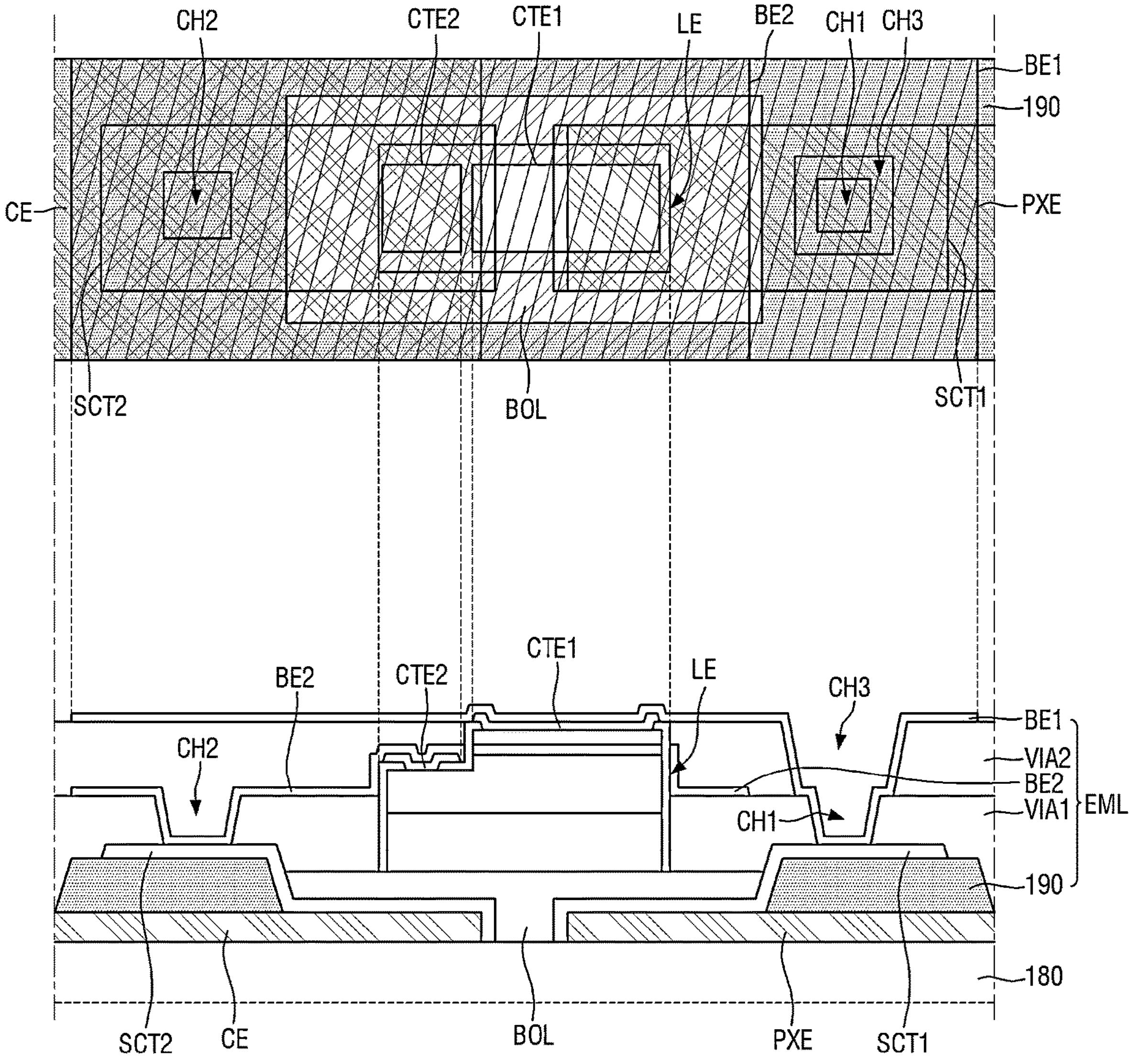

Fifth, referring to FIGS. 26 and 27, a second via layer VIA2 having a third connection hole CH3 is formed and an upper connection electrode BE1 is formed on the second via layer VIA2 (S150 in FIG. 15).

Referring to FIG. 26, an organic material is first applied to a height h2, and then a third connection hole CH3 is formed overlapping the first connection hole CH1 using a mask. The second via layer VIA2 is formed lower than the first contact electrode CTE1 of the light emitting element LE so that the first contact electrode CTE1 protrudes onto the second via layer VIA2.

Next, referring to FIG. 27, an upper connection electrode BE1 is formed on the second via layer VIA2 to cover the light emitting element LE. The upper connection electrode BE1 is connected to an exposed first reflective electrode SCT1 through a third connecting hole CH3 through the second via layer VIA2 and a first connecting hole CH1 through the first via layer VIA1.

Figure 28:
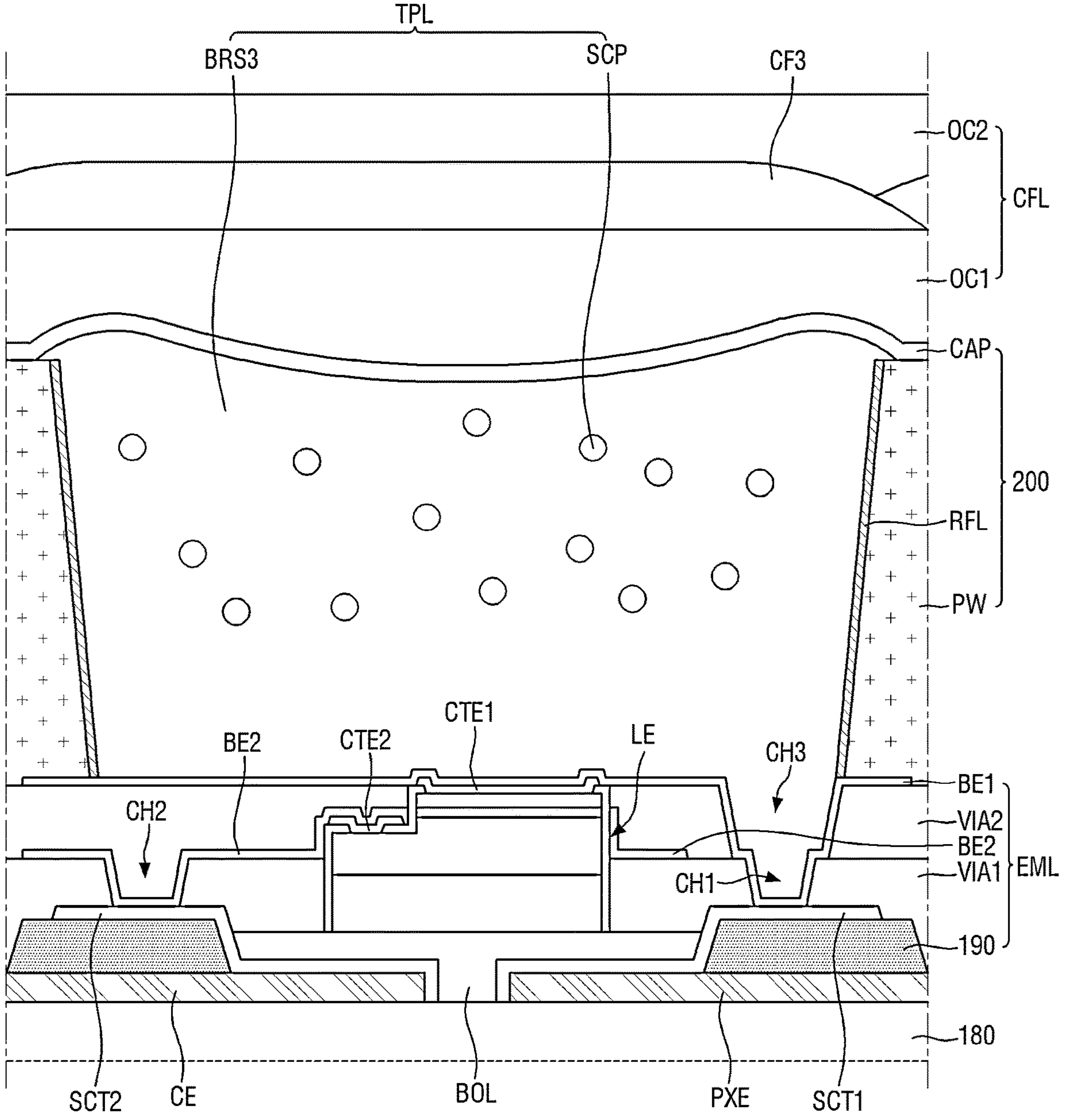

Next, referring to FIG. 28, an organic material is applied and the light blocking layer PW, the light conversion layers WCL1 and WCL2, the light transmission layer TPL, and the color filter layer CFL are formed by patterning (S160 in FIG. 15).

First, an organic material is applied on the upper connection electrode BE1 and patterned to form a light blocking layer PW. A reflective layer RFL may be formed on the inner surface of the space formed by the light blocking layer PW.

Then, the light blocking layer PW has an opening and a first light conversion layer WCL1 is formed within the opening. Among the areas partitioned by the light blocking layer PW, a first light conversion layer WCL1 is formed in the first sub-pixel SPX1, a second light conversion layer WCL2 is formed in the second sub-pixel SPX2, and a light transmission pattern TPL is formed in the third sub-pixel SPX3.

Then, a capping layer CAP, the first overcoat layer OC1, the first color filter CF1, and the second color filter CF2, the third color filter CF3, and second overcoat layer OC2 described in FIG. 7 may be formed on the light blocking layer PW, the light conversion layer WCL1 and WCL2, and the light transmission pattern TPL.

Figure 29:
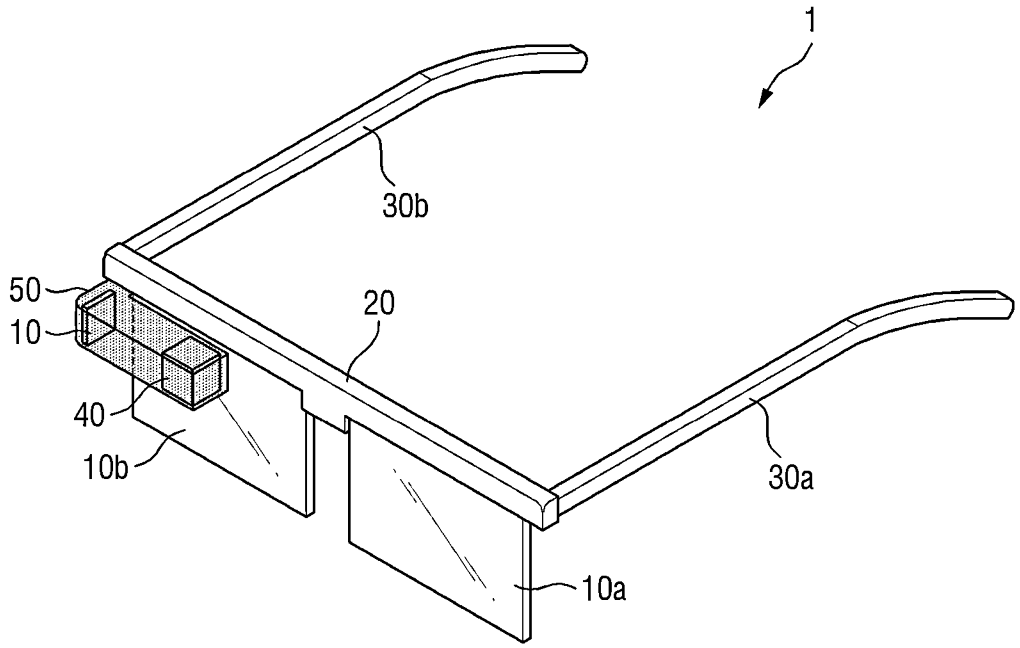
FIG. 29 is an example diagram schematically showing a virtual reality device including a display device according to one or more embodiments.

FIG. 29 is an example diagram illustrating a virtual reality device including a display device according to one or more embodiments. FIG. 29 illustrates a virtual reality device 1 in which the display device 10 according to one or more embodiments is used.

Referring to FIG. 29, the virtual reality device 1 according to one or more embodiments may be a device in a form of glasses. The virtual reality device 1 according to one or more embodiments may include a display device 10, a left-eye lens 10*a*, a right-eye lens 10*b*, a support frame 20, left and right legs 30*a* and 30*b*, a reflective member 40, and a display device housing 50.

FIG. 29 illustrates the virtual reality device 1 including the two legs 30*a* and 30*b*. However, the present disclosure is not limited thereto. The virtual reality device 1 according to one or more embodiments may be used in a head-mounted display including a head-mounted band that may be mounted on a head instead of the legs 30*a* and 30*b*. For example, the virtual reality device 1 according to one or more embodiments may not be limited to the example shown in FIG. 29, and may be applied in various forms and in various electronic devices.

The display device housing 50 may receive the display device 10 and the reflective member 40. An image displayed on the display device 10 may be reflected from the reflective member 40 and provided to a user's right eye through the right-eye lens 10*b*. Thus, the user may view a virtual reality image displayed on the display device 10 via the right eye.

FIG. 29 illustrates that the display device housing 50 is disposed at a right end of the support frame 20. However, the present disclosure is not limited thereto. For example, the display device housing 50 may be disposed at a left end of the support frame 20. In this case, the image displayed on the display device 10 may be reflected from the reflective member 40 and provided to the user's left eye via the left-eye lens 10*a*. Thus, the user may view the virtual reality image displayed on the display device 10 via the left eye. As another example, the display device housing 50 may be disposed at each of the left end and the right end of the support frame 20. In this case, the user may view the virtual reality image displayed on the display device 10 via both the left eye and the right eye.

Figure 30:
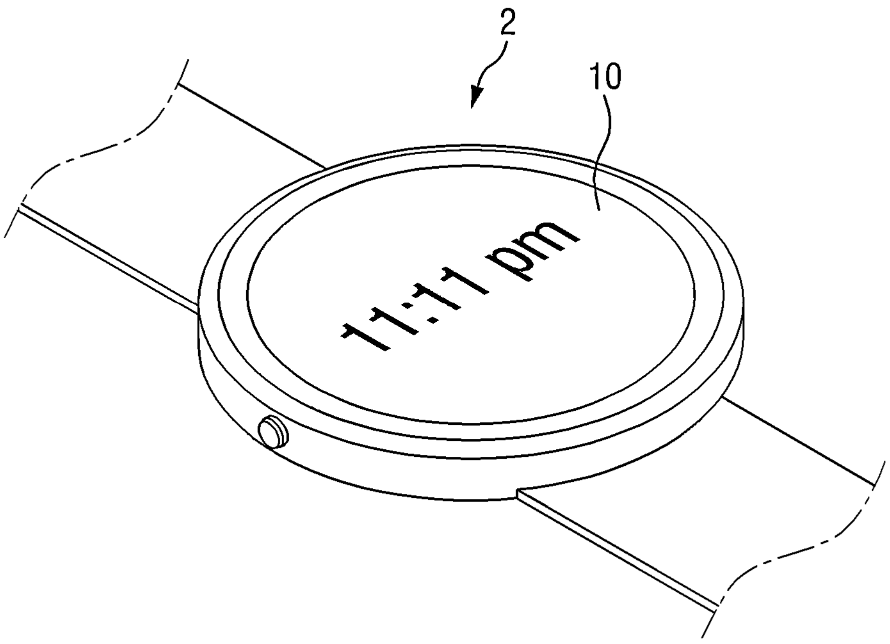
FIG. 30 is an example diagram schematically showing a smart device including a display device according to one or more embodiments.

FIG. 30 is an example diagram illustrating a smart device including a display device according to one or more embodiments.

Referring to FIG. 30, a display device 10 according to one or more embodiments may be applied to a smart watch 2 as one of smart devices.

Figure 31:
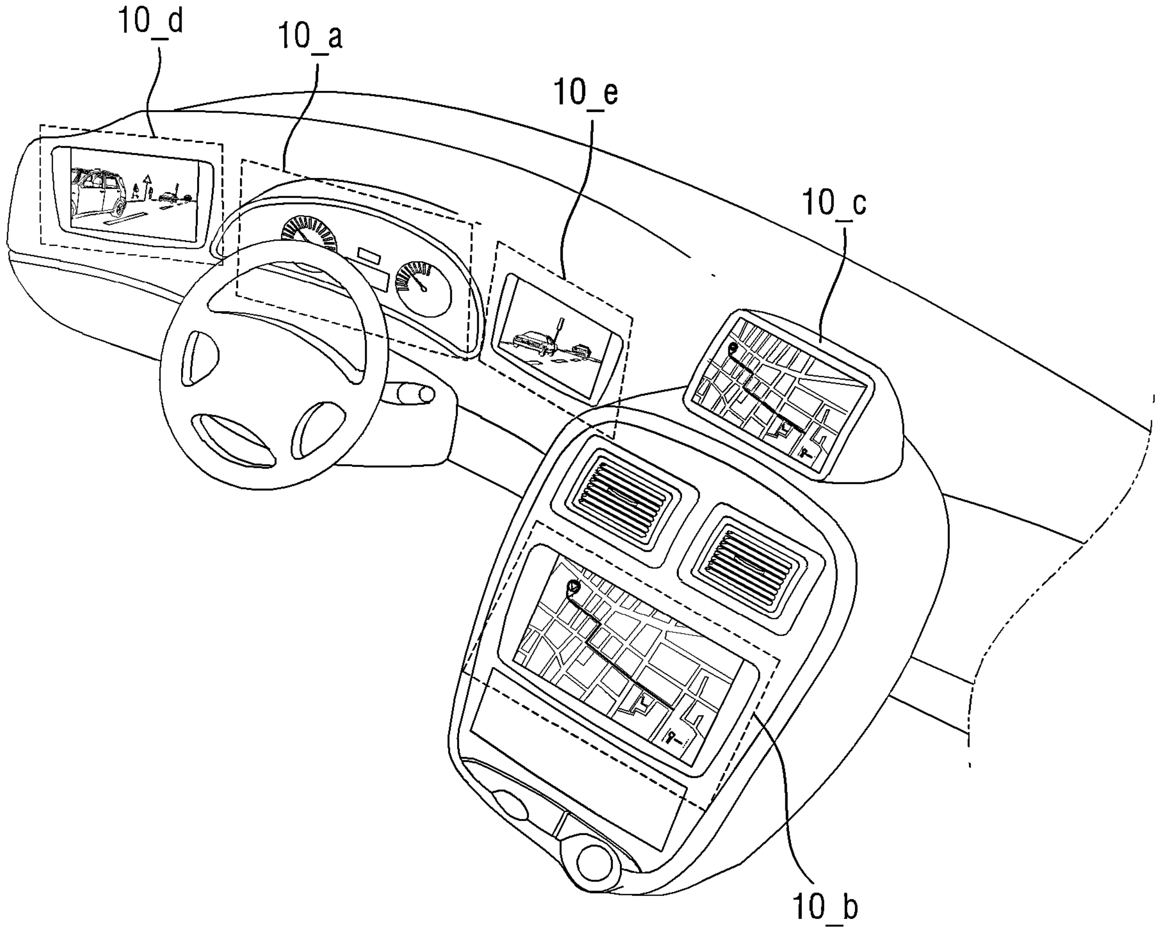
FIG. 31 is a diagram of an example schematically showing a vehicle including a display device according to one or more embodiments.

FIG. 31 is an example diagram illustrating a vehicle including a display device according to one or more embodiments. FIG. 31 illustrates a vehicle in which display devices according to one or more embodiments are used.

Referring to FIG. 31, the display devices 10_*a*, 10_*b*, and 10_*c* according to one or more embodiments may be applied to the dashboard of the vehicle, applied to the center fascia of the vehicle, or applied to a center information display (CID) disposed on the dashboard of the vehicle. Further, each of the display devices 10_*d* and 10_*e* according to one or more embodiments may be applied to each room mirror display that replaces each of side-view mirrors of the vehicle.

Figure 32:
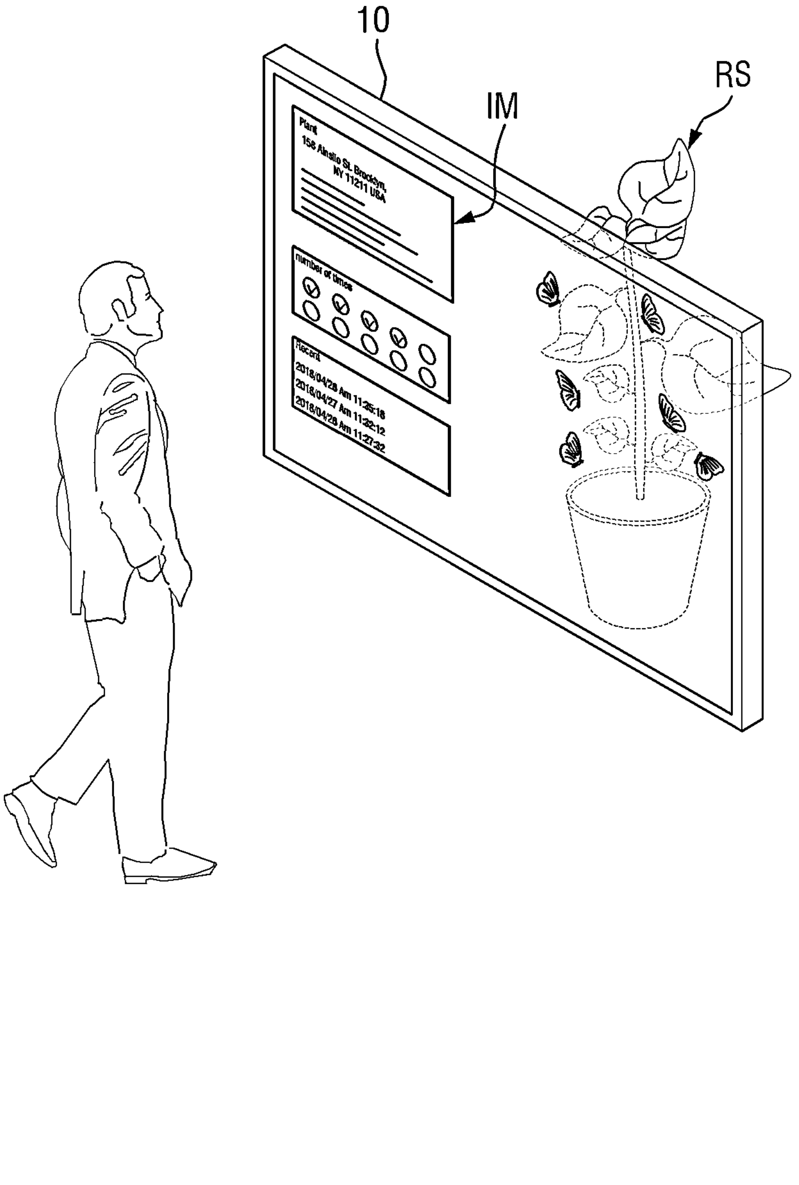
FIG. 32 is a diagram of an example schematically showing a transparent display device including a display device according to one or more embodiments.

FIG. 32 is an example diagram illustrating a transparent display device including a display device according to one or more embodiments.

Referring to FIG. 32, a display device 10 according to one or more embodiments may be applied to a transparent display device. The transparent display device may transmit light therethrough while displaying an image IM thereon. Therefore, a user located in front of the transparent display device may not only view the image IM displayed on the display device 10, but also view an object RS or a background located in rear of the transparent display device. In case that the display device 10 is applied to the transparent display device, the substrate SUB of the display device 10 shown in FIG. 7 may include a light transmitting portion that may transmit light therethrough or may be made of a material that may transmit light therethrough.

In concluding the detailed description, those skilled in the art will appreciate that many variations and modifications may be made to the embodiments without substantially departing from the principles of the disclosure. Therefore, the embodiments of the present disclosure are used in a generic and descriptive sense only and not for purposes of limitation.

What is claimed is:

1. A display device comprising:

a substrate;

a common electrode and a pixel electrode spaced from each other on the substrate;

a bank having an opening exposing a portion of the pixel electrode and the common electrode;

a first reflective electrode on a top surface of the bank along the opening on a top surface of the pixel electrode, and a second reflective electrode on a top surface of the bank along the opening on a top surface of the common electrode;

an organic pattern layer on the pixel electrode and the common electrode in the opening;

a light emitting element on the organic pattern layer and comprising a first contact electrode and a second contact electrode on a top surface;

a first via layer having a height that is less than that of the light emitting element;

a lower connection electrode on the first via layer and connecting the second contact electrode and the second reflective electrode;

a second via layer on the first via layer and the lower connection electrode; and an upper connection electrode on the second via layer and connecting the first contact electrode and the first reflective electrode.

2. The display device of claim 1, wherein an area of the lower connection electrode and an area of the upper connection electrode are each larger than an area of the light emitting element.

3. The display device of claim 2, wherein the area of the lower connection electrode is larger than an area of the common electrode.

4. The display device of claim 1, wherein the first via layer includes a first connection hole that overlaps the bank and exposes the first reflective electrode, and a second connection hole that overlaps the bank and exposes the second reflective electrode, wherein a third semiconductor layer of the light emitting element is in contact with the organic pattern layer, and wherein the second via layer includes a third connection hole that overlaps the first connection hole and exposes the first reflective electrode.

5. The display device of claim 4, wherein the lower connection electrode extends along the first via layer on the second contact electrode and contacts the second reflective electrode through the second connection hole, and wherein the upper connection electrode extends along the second via layer on the first contact electrode and contacts the first reflective electrode through the third connection hole and the first connection hole.

6. The display device of claim 1, wherein the common electrode, the lower connection electrode, and the upper connection electrode overlap in a thickness direction in an area where a second connection hole is located.

7. The display device of claim 1, wherein the second contact electrode overlaps the upper connecting electrode, the second via layer, and the lower connecting electrode in a thickness direction.

8. The display device of claim 1, wherein the first reflective electrode and the second reflective electrode are spaced from each other.

9. The display device of claim 1, wherein the light emitting element further comprises a third semiconductor layer, a second semiconductor layer, an active layer, a first semiconductor layer, and a protective layer, wherein the third semiconductor layer is in contact with the organic pattern layer, and wherein the protective layer is on a surface of the light emitting element in its entirety except for bottom of the light emitting element and has an opening exposing the first contact electrode and the second contact electrode on the top surface of the light emitting element.

10. The display device of claim 1, wherein a width of the organic pattern layer is greater than a width of the light emitting element.

11. The display device of claim 1, further comprising a light blocking layer on the upper connection electrode, overlapping the bank, and defining a light emitting area; and a wavelength conversion layer in a space between the light blocking layers.

12. The display device of claim 11, further comprising a capping layer, an overcoat layer, and a color filter layer sequentially located on the wavelength conversion layer and the light blocking layer.

13. A display device comprising:

a substrate;

a common electrode and a pixel electrode spaced from each other on the substrate;

an organic pattern layer on the pixel electrode and the common electrode;

a light emitting element on the organic pattern layer and comprising a first contact electrode and a second contact electrode on a top surface;

a first via layer having a height that is less than that of the light emitting element;

a lower connection electrode on the first via layer and connecting the second contact electrode and the common electrode;

a second via layer on the first via layer and the lower connection electrode; and an upper connection electrode on the second via layer and connecting the first contact electrode and the pixel electrode.

14. The display device of claim 13, wherein an area of the lower connection electrode and an area of the upper connection electrode are larger than an area of the light emitting element.

15. The display device of claim 14, wherein the area of the lower connection electrode is larger than an area of the common electrode.

16. The display device of claim 13, wherein the first via layer includes a first connection hole exposing the pixel electrode and a second connection hole exposing the common electrode, and wherein the second via layer includes a third connection hole that overlaps the first connection hole and exposes the pixel electrode.

17. The display device of claim 16, wherein the lower connection electrode extends along the first via layer on the second contact electrode and contacts the common electrode through the second connection hole, and wherein the upper connection electrode extends along the second via layer on the first contact electrode and contacts the pixel electrode through the third connection hole and the first connection hole.

18. A method of manufacturing display device comprising:

preparing a substrate on which a pixel electrode and a common electrode spaced from each other are located;

forming a bank having an opening exposing a portion of the pixel electrode and the common electrode;

forming a first reflective electrode on a top surface of the bank along the opening on a top surface of the pixel electrode, and a second reflective electrode on a top surface of the bank along the opening on a top surface of the common electrode;

forming an organic pattern layer covering edges of the first reflective electrode and the second reflective electrode, and bonding a light emitting element on the organic pattern layer;

forming a first via layer at a lower height than the light emitting element, and forming a lower connection electrode on the first via layer to connect a second contact electrode on a top surface of the light emitting element and the second reflective electrode; and forming a second via layer on the first via layer and the lower connection electrode and forming an upper connection electrode connecting a first contact electrode on the top surface of the light emitting element and the first reflective electrode on the second via layer.

19. The method of claim 18, wherein in the forming the first via layer at the lower height than the light emitting element and forming the lower connection electrode on the first via layer to connect the second contact electrode on the top surface of the light emitting element and the second reflective electrode, forming a second connection hole overlapping the bank through the first via layer, and wherein the lower connection electrode extends along the first via layer on the second contact electrode to connect the second reflective electrode through the second connection hole.

20. The method of claim 18, in the forming the second via layer on the first via layer and the lower connection electrode and forming the upper connection electrode connects the first contact electrode on the top surface of the light emitting element and the first reflective electrode on the second via layer, forming a first connection hole overlapping the bank penetrating the first via layer and a third connection hole overlapping the first connection hole penetrating the second via layer, and the upper connection electrode extending along the second via layer on the first contact electrode and contacting the first reflective electrode through the third connection hole and the first connection hole.

* * * * *